United States Patent
Wu et al.

(10) Patent No.: US 7,321,606 B2
(45) Date of Patent: Jan. 22, 2008

(54) LASER TRIM AND COMPENSATION METHODOLOGY FOR PASSIVELY ALIGNING OPTICAL TRANSMITTER

(75) Inventors: Hsin-Ho Wu, Santa Clara, CA (US); Peter Deane, Moss Beach, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 407 days.

(21) Appl. No.: 10/731,965

(22) Filed: Dec. 9, 2003

(65) Prior Publication Data

US 2005/0078722 A1   Apr. 14, 2005

Related U.S. Application Data

(63) Continuation-in-part of application No. 10/683,212, filed on Oct. 9, 2003.

(51) Int. Cl.
*H01S 3/00* (2006.01)
(52) U.S. Cl. ............... 372/38.1; 372/38.01; 372/38.02; 372/29.021; 372/29.011; 372/33
(58) Field of Classification Search .............. 372/26, 372/29.021, 33, 38.01, 38.02, 29.011, 29.01, 372/31, 32
See application file for complete search history.

(56) References Cited

U.S. PATENT DOCUMENTS

| | | | |
|---|---|---|---|
| 4,884,279 A | 11/1989 | Odagiri | |
| 4,903,273 A | 2/1990 | Bathe | |
| 5,019,769 A * | 5/1991 | Levinson | 372/31 |
| 5,073,838 A * | 12/1991 | Ames | 361/103 |
| 5,245,690 A | 9/1993 | Aida et al. | |
| 5,479,424 A | 12/1995 | Sakuyama | |
| 5,761,230 A | 6/1998 | Oono et al. | |
| 5,844,928 A * | 12/1998 | Shastri et al. | 372/38.02 |
| 5,974,063 A | 10/1999 | Yoshida | |
| 6,169,618 B1 | 1/2001 | Higashino | |
| 6,188,498 B1 | 2/2001 | Link et al. | |
| 6,321,003 B1 * | 11/2001 | Kner et al. | 385/24 |
| 6,351,476 B2 * | 2/2002 | Kner et al. | 372/20 |
| 6,400,737 B1 | 6/2002 | Broutin et al. | |
| 6,452,953 B1 | 9/2002 | Ushirozawa | |
| 6,480,314 B1 | 11/2002 | Kobayashi | |
| 6,862,302 B2 * | 3/2005 | Chieng et al. | 372/29.02 |

(Continued)

OTHER PUBLICATIONS

U.S. Appl. No. 10/638,212, entitled "Laser Trim and Compensation Methodology for Passively Aligning Optical Transmitter", Wu et al., filed Oct. 9, 2003.

*Primary Examiner*—Minsun Oh Harvey
*Assistant Examiner*—Delma R. Flores Ruiz
(74) *Attorney, Agent, or Firm*—Beyer Weaver LLP

(57) ABSTRACT

A method includes a scheme for trimming and compensation for a laser emitter in a fiber optic link. Data models of laser performance are provided and used to determine a base power level. It is then confirmed that the base power level is satisfactory. If necessary, adjustments are made to a set of user specified performance parameters until a satisfactory base power level is obtained. Then a table or relation of temperatures and associated current and target average optical power values is generated such that they can be used to regulate laser emitter performance over a range of temperature. Additionally, fiber optic links capable of trimming and compensation are also disclosed.

16 Claims, 12 Drawing Sheets

U.S. PATENT DOCUMENTS

| | | |
|---|---|---|
| 6,891,867 B2 | 5/2005 | Serizawa |
| 6,909,731 B2* | 6/2005 | Lu .......................... 372/29.01 |
| 6,947,455 B2* | 9/2005 | Chieng et al. ......... 372/29.021 |
| 6,956,408 B2* | 10/2005 | Schrodinger et al. ......... 327/66 |
| 2002/0093999 A1 | 7/2002 | Tanaka |
| 2002/0097468 A1* | 7/2002 | Mecherle et al. ........... 359/152 |
| 2002/0196595 A1* | 12/2002 | Ciancio .................... 361/93.1 |
| 2003/0007525 A1 | 1/2003 | Chen |
| 2003/0012244 A1* | 1/2003 | Krasulick et al. ............. 372/50 |
| 2004/0051938 A1 | 3/2004 | Chan et al. |
| 2004/0136422 A1* | 7/2004 | Mahowald et al. ...... 372/38.02 |
| 2004/0264518 A1 | 12/2004 | Chang |
| 2005/0078721 A1* | 4/2005 | Wu et al. ................ 372/38.01 |

* cited by examiner

LASER TRIM AND COMPENSATION METHODOLOGY FOR PASSIVELY ALIGNING OPTICAL TRANSMITTER

RELATED CASE

The invention described herein is a continuation-in-part application claiming priority from the U.S. patent application Ser. No. 10/683,212, entitled "Laser Trim and Compensation Methodology for Passively Aligning Optical Transmitter", invented by Wu and Deane. and filed on Oct. 9, 2003. The aforementioned document is hereby incorporated by reference.

TECHNICAL FIELD

The invention described herein relates generally to laser diode control methods and apparatus for use in an optical transmission system. In particular, the invention relates to methods and structures for quickly trimming a laser transmitter and providing accurate temperature compensation for the transmitter.

BACKGROUND

Laser diodes are used in optical transmission systems as light emitters. FIG. 1 illustrates a conventional laser diode behavior. Conventional laser diodes generate a characteristic optical power curve 110, in which three ranges can be distinguished. A pre-threshold portion A having a slight slope, in which there is no emission yet of coherent light. A "threshold area" B, which has a "knee" in the characteristic curve. Finally, a steeper portion of the characteristic curve includes a linear portion 111 having a constant slope, in which there is a linear correlation between the driving current and the optical power output.

Temperature changes affect diode behavior. For example, the second laser power curve 120 depicts the optical performance of the same laser diode at a higher temperature. The characteristic curve appears to shift to the right (as indicated by the arrow). Additionally, the slope of the linear portion commonly becomes shallower. Also, the threshold current values increase.

Thus, when the operating points (e.g., operating current levels $I_0$, $I_1$) are set for a diode at one particular temperature they are valid for the diode only as long as it remains at the same temperature. However, in ordinary course of operation diode temperatures can fluctuate significantly. As shown in FIG. 1 this leads to significant changes in diode operating parameters (e.g., threshold current, optical power output, diode slope efficiency, as well as many other significant operating parameters). This makes calibration and operating points set at one temperature invalid at other temperatures. What is needed is method and apparatus for trimming and compensating for the effects of changing temperature. Moreover, it would be desirable to have a method and apparatus capable of utilizing previously obtained laser characterization data to facilitate the set up and compensation schemes of the present invention. Additionally, it would be desirable to have an optical link having a laser apparatus capable of utilizing previously obtained laser characterization data to operate the laser using previously generated temperature and laser performance information to adjust the laser operating performance in accordance with changes in temperature to accommodate pre-defined operating conditions for the optical link.

SUMMARY OF THE INVENTION

In accordance with the principles of the present invention, the invention includes, among other things, a robust electrical connection and methods for its fabrication.

In one method embodiment, a scheme for trimming and compensation of a laser emitter in a fiber optic link is disclosed. The method involves determining a base power level for a population of lasers using data models that characterize laser performance for the population of lasers and determining a relationship between modulation current ($I_{mod}$) and temperature using the data models of laser performance. The method involves providing a selected laser device that is incorporated in a fiber optic link. A relationship between target average power and temperature for a specific laser device over a range of temperatures using the base power level is determined. Laser performance is adjusted based on the temperature, target average power, and modulation current ($I_{mod}$).

Another method embodiment involves providing data models that characterize laser performance for a population of lasers. The models are generated using laser performance data obtained from measurements of laser properties taken from a sample population of lasers. A base power level is determined using information from the data models and from a predetermined set of user specified performance parameters. It is then determined whether the base power level satisfies a set of pre-specified operating parameters. Where the base power level satisfies a set of pre-specified operating parameters, the base power level is found satisfactory and the process moves on to the next operation of generating a table of temperatures and associated current values that can be used to regulate laser performance over a range of temperature. Where the base power level does not satisfy the set of pre-specified operating parameters, user specified performance parameters are adjusted until the base power level is satisfactory.

Embodiments of the invention further include an optical link apparatus suitable for implementing the trim and compensation methodologies of the present invention. Such device includes a laser emitter in an optical link trimmed using the base power level and implementing temperature compensation for the effects of temperature by accessing the table of temperatures and associated current values to regulate the laser emitter performance as temperature changes.

Another embodiment proscribes an optical link suitable for coupling with an optical fiber in the optical link. Such link includes a semiconductor laser emitter in optical communication with an optical fiber, a monitor element for measuring the optical power produced by the semiconductor laser emitter, and a temperature sensor for detecting the temperature of the semiconductor laser emitter. Also, the link has a look-up table having stored values for current information associated with temperature. The link also includes laser driver circuitry for receiving temperature dependent current information from the table and using said current information to provide a driving current to the semiconductor laser emitter so that the laser emits an optical signal having a desired optical power.

These and other aspects of the invention will be disclosed in greater detail in the following detailed description.

BRIEF DESCRIPTION OF THE DRAWINGS

The following detailed description will be more readily understood in conjunction with the accompanying drawings, in which:

FIG. 7($b$) is a flow diagram illustrating an aspect of the method embodiment depicted in FIG. 7($a$) directed toward generating a BPL in accordance with the principles of the present invention.

FIG. 7($c$) is a flow diagram illustrating an aspect of the method embodiment depicted in FIG. 7($a$) directed toward determining if a BPL is satisfactory in accordance with the principles of the present invention.

FIG. 7($d$) is another flow diagram illustrating a method embodiment depicted for determining if a BPL is satisfactory in accordance with the principles of the present invention.

FIGS. 8($b$) and 8($c$) are simplified graphical depictions of slope efficiency data showing the effects of coupling efficiency and error margins in accordance with the principles of the invention.

FIG. 8($d$) is a graphical depiction of a relationship between laser threshold current and temperature in accordance with the principles of the invention.

FIG. 8($e$) is a graphical depiction of a laser power curve depicting associated laser optical power with threshold current and offset current values in accordance with the principles of the invention.

It is to be understood that in the drawings like reference numerals designate like structural elements. Also, it is specifically pointed out that the depictions in the drawings are not necessarily to scale.

DETAILED DESCRIPTION OF THE INVENTION

Figure 1:
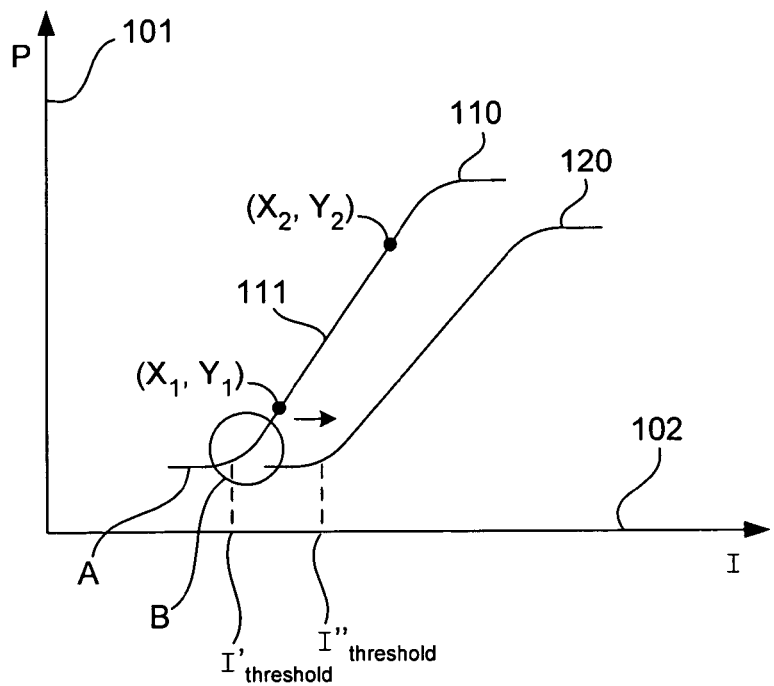
FIG. 1 is a graphical depiction semiconductor laser output power as a function of bias current at two example temperatures.

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

One aspect of the invention teaches methodologies for establishing a trim and compensation scheme for a laser device to be used in an optical link. In one aspect, a laser can be trimmed (i.e., set-up to have initial laser optical performance characteristics that fall within a pre-determined specification) using previously obtaining laser performance information in combination with a set of user specified performance parameters. In another aspect, the invention encompasses methodologies for determining and applying a temperature compensation scheme that can be used to provide a temperature dependent regulation of laser operating conditions so that the laser demonstrates (operates within) optical performance characteristics that fall within a pre-determined specification over a range of operating temperatures (commonly, over a predetermined temperature range). In trimming a laser, a base power level is determined and used for further compensation schemes. Advantageously, the base power level can be determined without measuring the specific properties of the particular laser being set up. All that is needed to determine the base power level is a collection previously obtained laser performance measurements gathered from a sample population of lasers selected from among a group of lasers. This data can be used to set up a trim and compensation scheme for all the lasers in the group (e.g., lasers similar to the measured sample population of lasers). The laser performance information obtained from the measured sample population of lasers can be used to generate data models of laser performance that in turn can be used to characterize an entire group of similar lasers. Coupling efficiency information can also be obtained and used. Such information concerns the coupling efficiency of a sample population of lasers in a fiber optic link of the type to be used.

One aspect of the invention includes a trimming scheme for reliably trimming a passively aligned optical transmitter. Embodiments of the invention include an optical emitter (typically, a laser diode) coupled to an optical fiber using an optical link. In accordance with the principles of the invention, such embodiments do not require active alignment or other positional adjustments of the emitter with respect to the fiber in order to project the necessary power level into the fiber. Rather, the desired power level is attained by setting a correct initial power level (trimming the laser) and continuously adjusting the laser modulation current (compensation) to adjust for temperature dependent variation in laser power. Such a scheme, implemented in accordance with the principles of the invention, can accommodate optical power variation factors due to: laser characteristics, manufacturing processes, temperature changes, passive alignment tolerances, and optical and/or mechanical coupling misalignments (for example, due to passive alignment) between a laser emitter and an associated optical fiber in a fiber optic link.

One particular benefit realized by embodiments of the invention is the ability to take advantage of previously acquired laser performance data and optical power coupling efficiency data. Importantly, embodiments of the invention can take advantage of pre-assembly measurements and calculations to set a base power level (BPL) which can be used to determine operating points for in an optical transmitter (i.e., a laser emitter). Additionally, a temperature dependent compensation scheme is constructed using pre-assembly measurements and calculations so that optical power output, optical signal quality, and current values for the transmitter can meet a set of pre-defined operating parameters over a range of laser operating temperatures.

Embodiments of the invention can set the operating points of laser emitters requiring information from only data models of laser behavior. Such data models of laser behavior are generated using measurements of laser performance concerning a sample population of a group of manufactured laser emitters. These basic measurements can be performed in a fully pre-programmed and automatic manner. Additionally, trim and compensation embodiments in accordance with the principles of the invention provide flexibility in selecting different operating points for the optical emitters so that a user can emphasize various operating parameters (e.g., extinction ratio, reliability, optical signal quality, and power consumption) in order to optimize the lasers for a given task. Device embodiments constructed in accordance with the principles of the invention can be controlled using microprocessors or dedicated ASIC's.

Embodiments of the invention make extensive use of previously determined laser performance information derived from statistical analysis of sample populations of lasers. Commonly, laser emitters of any given type are mass-produced having substantially similar operating characteristics. In order to characterize these lasers, representative samples are taken for analysis. For example, if 100,000 1 mW VCSEL lasers are manufactured, a representative sample population of this group of the lasers is measured. Such a sample can comprise, for example, 5,000 lasers. This sample population can be tested to determine many of the operational characteristics of the manufactured lasers.

Many characteristics of the lasers can be analyzed in this fashion. Particular laser properties useful in accordance with the principles of the invention include slope efficiency (SE) and threshold current ($I_{threshold}$ or $I_{th}$). Using the measured sample population of lasers, these properties can be determined and statistically analyzed for each type of manufactured laser. For example, both slope efficiency (SE) and threshold current ($I_{th}$) vary with temperature. Consequently, in order to calculate appropriate operating conditions for a laser and maintain a stable laser optical output power over a range of operating temperatures, laser performance is analyzed with respect to temperature. In particular, it is important to determine the effect that changing temperature has on, for example, laser bias and modulation currents.

FIG. 1 graphically depicts the output power of a semiconductor laser as a function of bias current. Laser performance can be depicted as laser power curves (110, 120) that map optical output power 101 of the laser as a function of bias current 102. A first laser power curve 110 depicts the threshold current ($I'_{th}$) at which the laser first begins to produce optical power. The first laser power curve 110 includes a linear portion 111 (sometimes referred to as a diode line) wherein the optical power and the bias current are in a linear relationship with respect to one another. The linear portion 111 of the curve can be described by its slope efficiency (SE), which is the slope of linear portion 111 of the curve 110. As the temperature of the diode increases, its behavior changes. For example, the second laser power curve 120 depicts the optical performance of the same laser at a higher temperature. For one, the curve appears to shift to the right (as indicated by the arrow). The threshold current ($I''_{th}$) increases and the slope efficiency is reduced.

As shown, the optical output power of laser diodes is affected by threshold current ($I_{th}$) and slope efficiency (SE) characteristics and both vary with temperature. Models characterizing laser diode behavior with respect to temperature can be obtained in a number of different manners. Essentially, laser power and bias currents are measured at different temperatures and after a number of different lasers have been measured, a fairly representative model of laser behavior can be generated.

Figure 2:
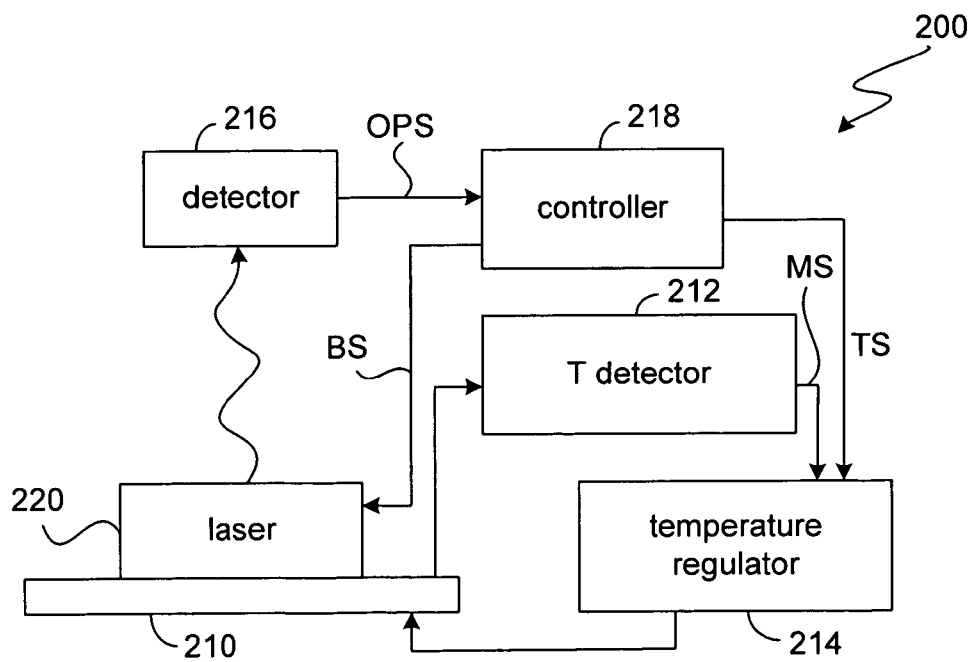
FIG. 2 is a block diagram that illustrates an example of a test set up that can measure threshold currents and slope efficiencies for a reference laser diode over a desired range of temperatures in accordance with the principles of the present invention.

FIG. 2 shows a simplified block diagram that illustrates an example of a test set up 200 that can be used to measure threshold currents ($I_{th}$) and slope efficiencies (SE) for a reference laser diode over a desired range of temperatures. The depicted set up 200 includes a laser diode 220 attached to a base structure 210 and an adjustable cooling/heating source 214. A temperature detector 212 is used to detect the temperature of the laser diode 220 during testing. In operation, temperature detector 212 detects the temperature of base structure 210 (and thereby the temperature of the laser diode 220), and outputs a measured temperature signal MS. The adjustable cooling/heating source 214 receives a temperature signal TS from the controller 218 that associated with a desired temperature for the base structure 210, and receives the measured temperature signal MS (which is associated with the temperature of the base structure 210). In response, cooling/heating source 214 chills or heats base structure 210 to obtain the temperature defined by the temperature signal TS.

Further, test set up 200 includes an optical power detector 216 and a controller 218. Optical power detector 216 detects the optical power of a light beam and outputs an optical power signal OPS associated with the magnitude of the received optical power from the laser diode 220. The optical power signal OPS is received by controller 218. The controller 218, in turn, outputs the temperature signal TS to adjustable cooling/heating source 214 to set the temperature of base structure 210, and a bias signal BS to a reference laser diode 220 to control the magnitude of the bias current ($I_B$) input to the laser diode 220. The controller 218 also receives the optical power signal OPS and, based on the received optical power, determines the $I_{th}$ for the reference laser diode 220 at each measured temperature.

Figure 3:
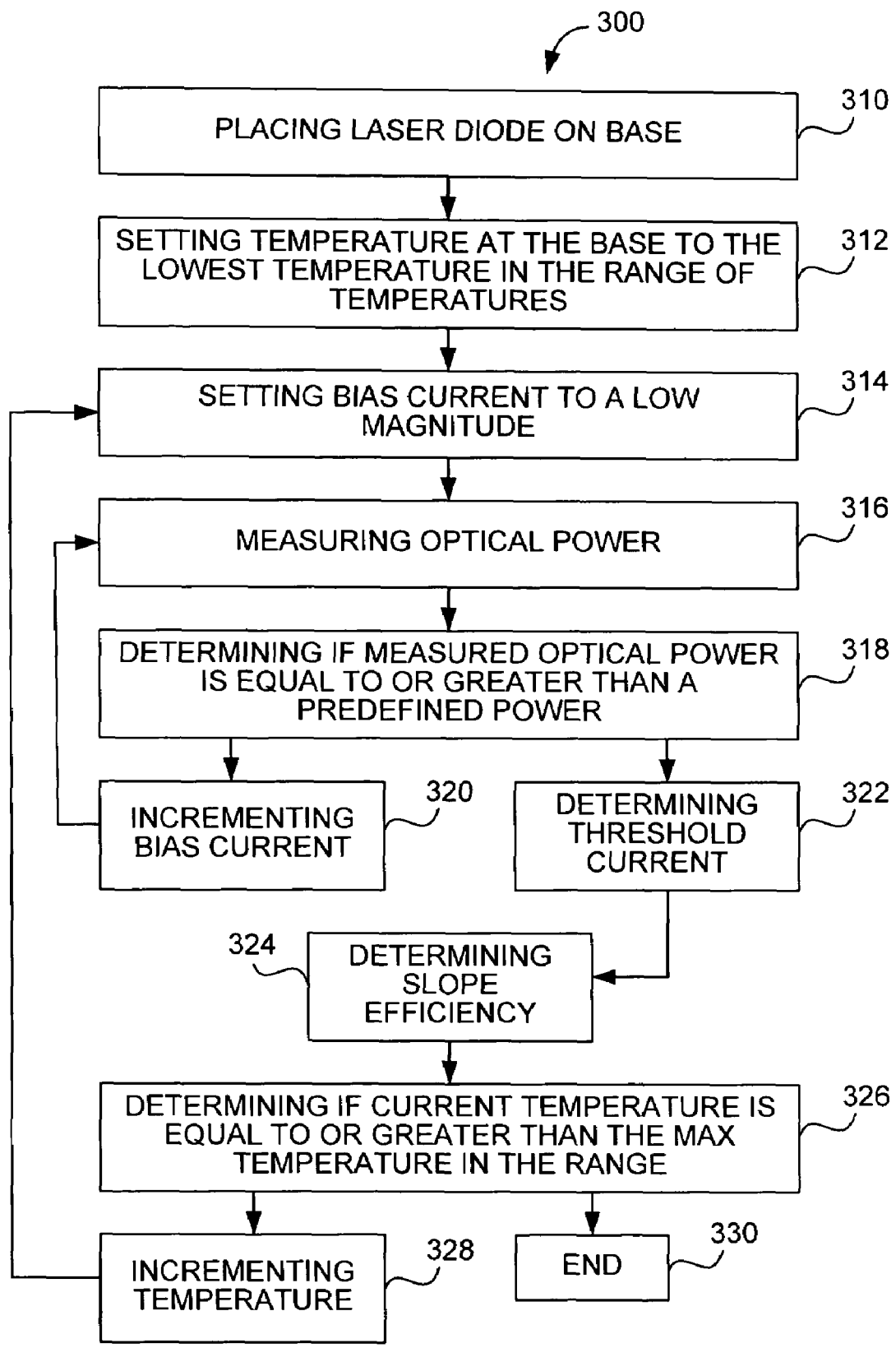
FIG. 3 is a flow diagram that illustrates a method embodiment for obtaining laser diode test information in accordance with the principles of the present invention.

FIG. 3 depicts a flow diagram 300 that illustrates one example of a suitable method of operating test set 300 up in accordance with the present invention. The method 300 begins at Step 310 by placing measured laser diode 220 on base structure 210. The temperature of the laser diode is regulated by the temperature of base structure 210. The measured laser diode 220 is aligned with optical power detector 216, and connected to receive the input bias signal BS. At Step 312 the controller 218 outputs the temperature signal TS with a value that sets the temperature on base structure 210 equal to the lowest temperature in the range of temperatures. Next, method 300 moves to Step 314 where controller 218 outputs the input bias signal BS with a value that causes the bias current to have a low magnitude. After this, method 300 moves to Step 316 to measure the optical power of the light output by measured laser diode 220, and then to Step 318 to determine if the measured optical power is equal to or greater than a predefined power level. If the measured optical power is less than the predefined power level, method 300 moves to Step 320 where controller 218 changes the input bias signal BS to cause the bias current to be incremented by a predetermined amount. Method 300 then returns to Step 316 to measure the optical power of the light output by measured laser diode 220. Method 300 continues to loop through Steps 320, 316, and 318 until the measured optical power is equal to or greater than the predefined optical power for measured laser diode 220.

When the measured optical power is equal to or greater than the average optical power of measured laser diode 220, method 300 moves to Step 322 to determine the threshold current ($I_{th}$) of measured laser diode 220. The $I_{th}$ can be determined using any of a number of different methodologies known to persons having ordinary skill in the art. Example conventional methods include algorithms for detecting a "knee" in a curve. Such algorithms are well known to those having ordinary skill in the art.

After $I_{th}$ has been determined, method 300 moves to Step 324 to determine the slope of a diode line (DL). As shown in FIG. 1, the slope can be graphically determined by using any two points on the linear portion of the operating curve for the laser diode. For example, the slope of curve 110 can be determined by using a first point ($X_1$, $Y_1$) on the linear portion 111 that is greater than $I_{th}$, and a second point ($X_2$, $Y_2$) on the linear portion 111. This will yield a slope or slope efficiency (SE)=$(Y_2-Y_1)/(X_2-X_1)$.

Once the slope of the linear portion has been determined, the method moves to Step 326 to determine if the current temperature is equal to or greater than the maximum temperature of the desired range of temperatures. If the current temperature is less than the highest temperature of the range, method 300 moves to Step 328 to change the temperature signal TS to a value that causes cooling/heating source 214 to incrementally increase the temperature of base structure 210 by a predetermined amount.

The method then returns to Step 314 where controller 218 outputs the input bias signal BS with a value that causes the bias current to have the low magnitude. The method continues to loop until $I_{th}$ and the slope have been determined for each temperature increment within the range of temperatures. When, at Step 326, the temperature is equal to or greater than the maximum temperature in the desired range of temperatures the method moves to Step 330 to end.

Figure 4:
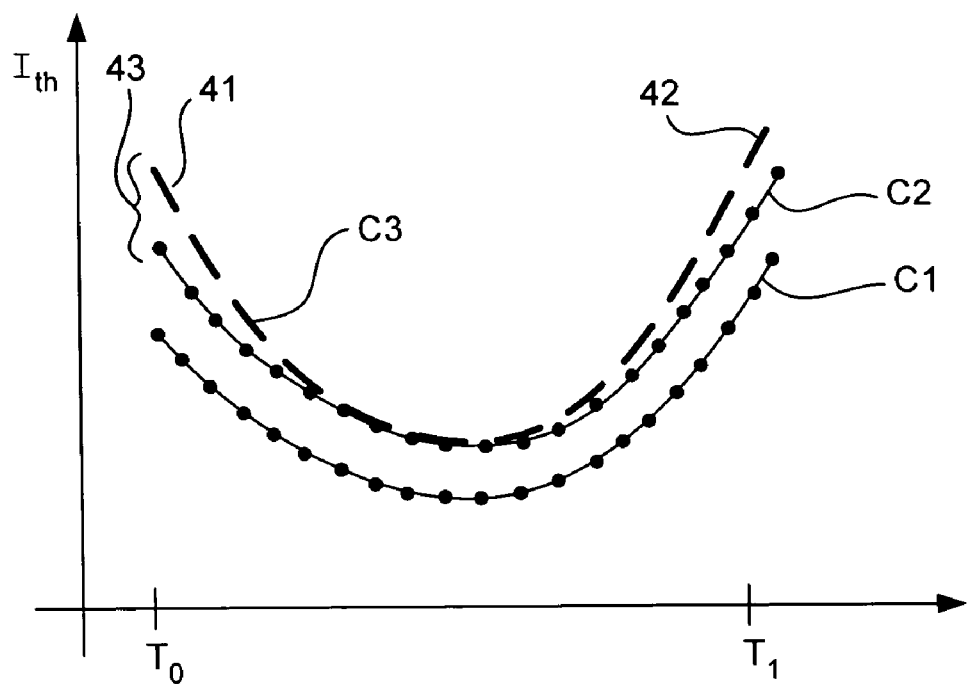
FIG. 4 graphically depicts a relationship between laser diode threshold current and temperature in accordance with the present invention.

FIG. 4 graphically depicts an exemplary relationship between $I_{th}$ and temperature in accordance with the present invention. As shown in FIG. 4, a first curve C1, depicting $I_{th}$ versus temperature, can be plotted for each temperature increment in the range of temperatures ($T_0$ for the lowest temperature in the range and $T_1$ for the highest temperature in the range) for the measured laser diode. Curve C1 has a wide "U" shape indicating that the $I_{th}$ falls as the temperature increases to a center point, then increases as the temperature increases beyond the center point. Commonly, each laser diode has its own characteristic U-shaped curve (e.g., another example diode is depicted using the second curve C2). Typically, a lot of diodes will be manufactured and a number of these diodes will be selected as a sample population. These sample diodes will be measured and used to characterize the lot of manufactured diodes. This can be done by for each lot of diodes (or for any other suitable grouping of diodes). In this way, the laser diodes can be characterized by data models. Such models can be used to statistically characterize a population of lasers. However, such curves (e.g., C1, C2) are subject to some degree of error margin that can be caused by, for example, measurement errors or limitation of the measurement techniques or other causes. Curve C3 illustrates, in one example, the variation in the shape of curves (e.g., curve C2). Additionally, the magnitude of such errors is commonly more pronounced at the ends 41, 42 of the curves. The data models generated can have measurement variations as great as 30% of the measured values. One example of such an error margin 43 is depicted at the low temperature end 41 of a curve. Additionally, beyond measurement and modeling errors, some types of laser diodes (e.g., VCSEL's) can exhibit significant changes in threshold current over an operational lifetime. Consequently, the $I_{th}$ error margin increases when device aging is considered. Thus, method and device embodiments of the disclosed invention are constructed to compensate for such error margins.

Figure 5:
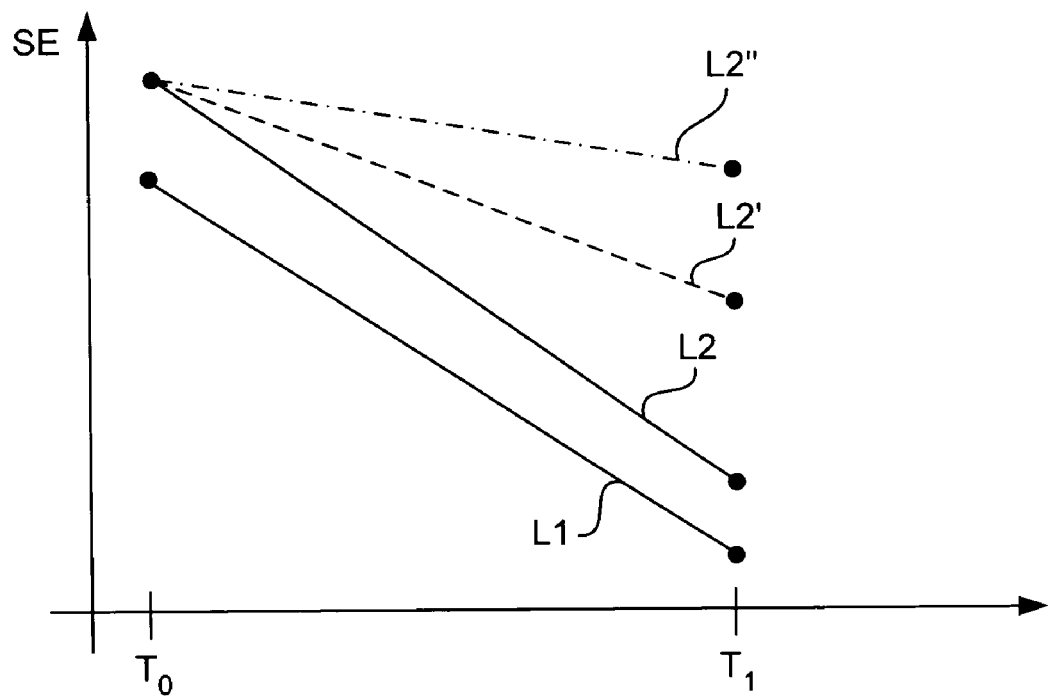
FIG. 5 graphically depicts a relationship between laser diode slope efficiency and temperature in accordance with aspects of the present invention.

Additionally, the manufactured diodes can be characterized with respect to slope efficiency (SE). FIG. 5 is an exemplary graphical depiction of a relationship between slope efficiency (SE) and temperature in accordance with the present invention. As shown in FIG. 5, slope efficiency versus temperature curve L1 can be plotted once a linear portion has been determined for each temperature increment in the range of temperatures for a measured diode. Thus, each measured diode can be expressed, both, in terms of its current $I_{th}$ versus temperature profile (for example, C1 FIG. 4) and in terms of its slope efficiency versus temperature profile (for example, L1 FIG. 5). As with the $I_{th}$ model described with respect to FIG. 4, models of SE versus temperature can be used to statistically characterize a population of lasers. These curves (e.g., L1, L2) are also subject to some degree of error margin. This error margin is commonly reflected by the variations in the slope of the SE v. temperature line (e.g., variations in the slope of L1 and/or L2). One exaggerated example is depicted with reference to lines L2, L2', and L2", which schematically depict some of the variation encountered in measurements of a SE v. temperature curve. This variation or error margin is captured by a slope efficiency temperature coefficient (TC) which is expressed in percentage variation in SE per degree centigrade (%/° C.).

After repeating $I_{threshold}$ and SE measurements over a pre-defined temperature range for a sufficient number of laser diodes, statistical analysis can be performed on the measured data for a measured diode population. Such statistical analysis can be used to derive values for the mean, standard deviation, maximum, and minimum for the measured $I_{th}$ and SE. These as well as other statistically related values can be used to determine operating points for optical transmitters in accordance with the embodiments of the invention (examples of which are described in further detail hereinbelow). The accumulated data and the associated statistical results can also be used to construct laser data models that characterize laser performance. For example, the data can be used to construct data models of temperature versus $I_{th}$ or SE to describe laser performance. For example, FIGS. 4 and 5 show possible $I_{th}$ and SE data models that can estimate $I_{th}$ and SE temperature behaviors based on sampling of selected laser diodes from production runs.

Many other additional factors can be considered in determining operating points for laser emitters in accordance with the principles of the invention. As is known to those with ordinary skill, optical networks include many optical nodes. Each node can include a fiber optic link that couples the laser emitter to an associated optical fiber. At each link there exists an optical connection between a transmitter (e.g., a laser) and an associated optical fiber. Moreover, at each link there exist certain optical coupling inefficiencies. These inefficiencies describe, grossly, an accumulation of mechanical and optical misalignments as well as other coupling imperfections. The type and configuration of laser transmitter, the optical and mechanical designs of the link, and a variety of other factors (all well known to persons having ordinary skill in the art) affect the optical power level that will be coupled into the associated optical fiber. In order to maintain a desired optical power level projected into the associated optical fiber, the effects of the coupling inefficiencies and other possible power variations should be known and accommodated by methods incorporating the principles of the invention.

The coupling efficiencies (CE) for a given design can be determined using a number of methods known to persons having ordinary skill in the art. For example, once the transmitter laser diode is characterized (e.g., the threshold currents ($I_{th}$) and slope efficiencies (SE) are measured over a range of temperatures) the laser diode can be driven at a selected bias current (set above the $I_{th}$) and the output power from the laser can be measured. The output power difference between the power produced by the laser transmitter and the power coupled into the fiber is a measure of the coupling efficiency.

Figure 6:
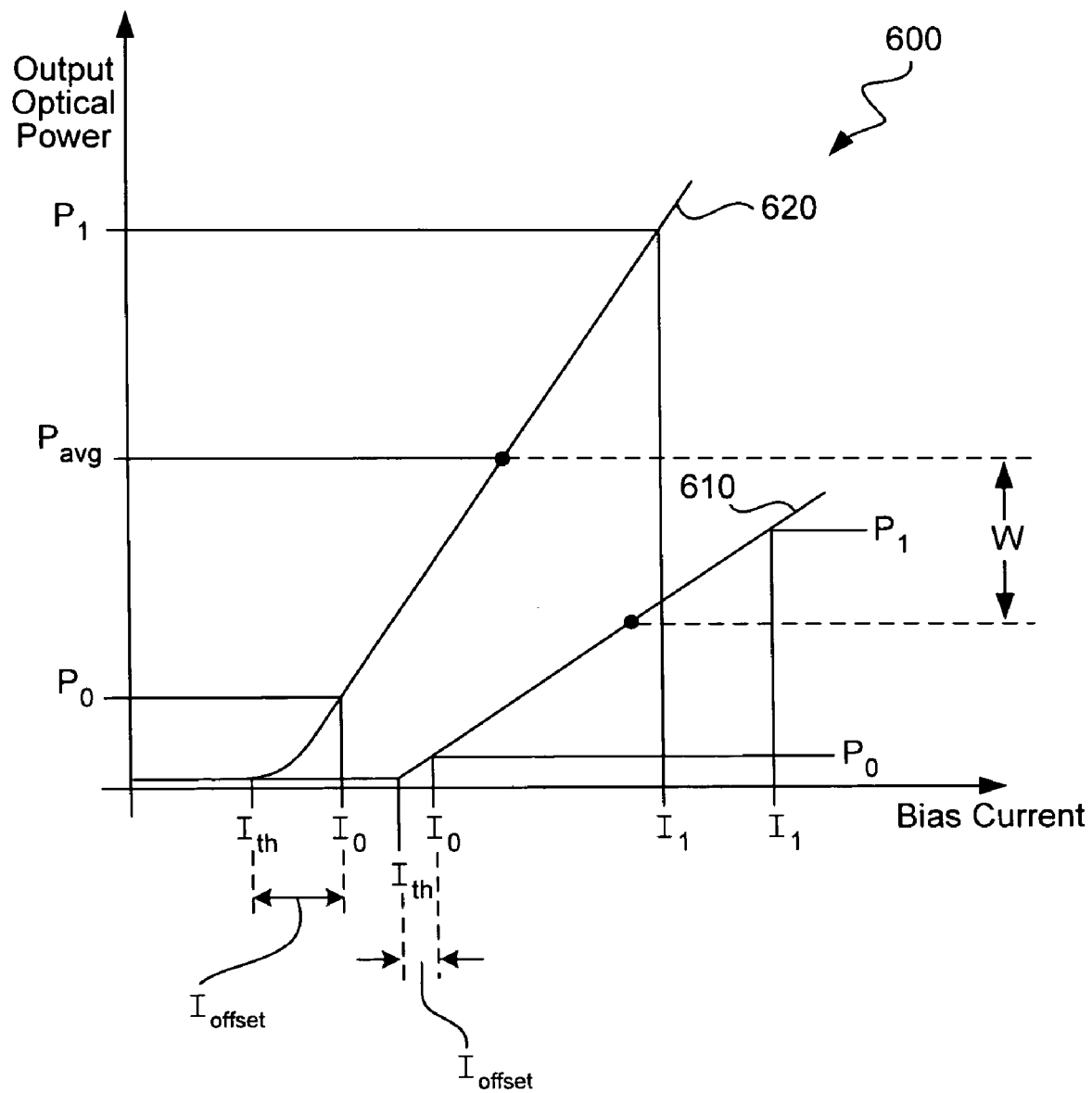
FIG. 6 is a simplified graphical depiction of the optical output of a laser device as compared to bias current that can be used to illustrate certain aspects of the invention.

FIG. 6 is a simplified graphical illustration of the optical output of a laser device. The diagram 600 depicts the optical output power of a VCSEL laser device at two different operating temperatures. The diagram is similar to that depicted in FIG. 1. A first low temperature power curve 610 depicts the relationship between bias current and output optical power. This curve 610 is characteristic of laser performance at temperatures near the lower end of an operational temperature range (e.g., at room temperature). Another, second high temperature power curve 620 depicts the relationship between bias current and output optical power at a higher temperature near the top of the operational temperature range.

Definitions

With continuing reference to FIG. 6, the following definitions will aid in the explanation of the embodiments of the invention.

$$P_0 = (I_0 - I_{th}) \cdot SE = I_{offset} \cdot SE \qquad \text{Eqn. 1}$$

$$P_1 = (I_1 - I_{th}) \cdot SE \qquad \text{Eqn. 2}$$

$$P_{avg} = \frac{P_0 + P_1}{2} \qquad \text{Eqn. 3}$$

$$ER = \frac{P_1}{P_0} \qquad \text{Eqn. 4}$$

$P_0$ defines the optical power level at which the laser is considered to be at a "low" power output state corresponding to a logical "0" or "off" in a binary transmission. $P_0$ is the optical "zero" for the laser. SE is the slope efficiency of a laser when the laser driving current is in the linear region of laser performance. $I_{threshold}$ (or $I_{th}$) is the threshold current for the laser where the laser begins to emit an optical signal. $I_{offset}$ sets a minimum difference between $I_0$ and $I_{th}$. $I_{offset}$ is set so that $I_0$ is sufficiently above $I_{th}$ thereby reducing jitter in optical output signal. $I_0$ is a driving current associated with $P_0$.

$P_1$ is the minimum power at which the laser is considered to be at a "high" power output state that normally corresponds to a logical "1" or "on" in a binary transmission. $I_1$ is a driving current associated with $P_1$.

$P_{avg}$ is the average power for the laser in a specified power range. As depicted, $P_{avg}$ is the average of $P_1$ and $P_0$. Additionally, W defines a specified power range window. The window W is a boundary condition that describes the acceptable range of power variation over an operational temperature range. Additionally, window W can be used as a user defined boundary condition that describes a desired range of power variation over an operational temperature range. As depicted here, W is the power range for $P_{avg}$ over a predetermined temperature range. For example, the window W can define an acceptable power range between two $P_{avg}$ values (i.e., the acceptable power difference between a high temperature $P_{avg}$ and a low temperature $P_{avg}$) for a diode laser. Generally, the window W is a user specified performance parameter commonly pre-specified to accommodate certain system minimum performance requirements. For example, the window W can be used to accommodate optical link budget, diode reliability concerns, and production yield concerns.

For example, laser diodes are less efficient at high temperature because the threshold current is higher and the slope efficiency is decreased. Consequently, at high temperature the laser is driven with higher current to reduce the drop in optical output power. This is reflected in a smaller window W. Also, if the optical link budget is tight, the W can be reduced at the cost of requiring a higher driving current. Thus, W can be used to accommodate the optical link budget. An optical link budget defines the optical power levels and signal quality needed to accommodate signal transmission requirements in an optical system. Such requirements take into consideration factors including, but not limited to, link length, jitter, bit error rate (BER) as well as a number of other related factors commonly known to persons having ordinary skill in the art. Also, laser diode reliability (laser diode lifetime) is closely related to the average driving current ($I_{avg} = (I_1 + I_0)/2$). Higher driving currents reduce laser diode reliability (lifetime). Thus, for a given optical link budget, a lower driving current can be used to improve reliability (i.e. lead to longer laser diode lifetimes). This can be controlled by adjusting the window W. For example, given a specified optical link budget, an increased window W value permits a laser diode to operate using a smaller bias current at higher temperatures. Consequently, such a diode will have a longer operational lifetime (better reliability). However, the increased window W can result in a laser diode transmitting at a lower optical power. This can result in increased BER and reduce the link distance. Additionally, an increased window W can affect production yield because some less efficient laser diodes may not be qualified for a give design. By studying the tradeoffs between reliability, yield, and link performance, a desired window W value can be determined. Additional factors can affect the choice of W value. As is known to persons having ordinary skill in the art, laser diode operation is affected by current. For example, for a given optical link budget and extinction ratio (ER), it is possible that $I_1$ or the average current ($I_{avg}$) may be too high. This has undesirable effects that are especially prevalent in less efficient laser diodes (e.g. lasers having small SE). For example, the reliability of such diodes can be significantly reduced. Also, laser driving circuitry may place limits on the maximum laser diode driving current. By controlling the power window W, $I_1$ and average current can be adjusted to accommodate the specific laser diode and circuitry characteristics. This can improve production yield.

Another useful user specified performance parameter is the extinction ratio (ER) which specifies a ratio between the power "on" to the power "off", that is to say the ratio between P1 (the power level $P_1$ defining a logical "1" and $P_0$ the power level at which a logical "0" is defined). The ER is the ratio of $P_1$ to $P_0$ as indicated in Eqn. 4 above. Generally, the ER is pre-specified to accommodate certain system minimum performance requirements. For example, an ER of about 9 dB or greater is suitable for most systems with a ER of 13 dB or greater preferred in most system.

Base Power Level (BPL)

Having disclosed and explained some basic terms. Some method embodiments of the invention are disclosed for determining a base power level to be used in trimming a laser; determining whether base power level will satisfy a set of pre-specified operating parameters; generating a table that can be used to regulate laser performance over a range of temperatures to maintain a desired laser output optical power and/or maintain a desired laser operating currents.

Embodiments of the invention take advantage of the previously obtained laser performance data and laser coupling efficiency data to set operating points for individual lasers in the characterized group of lasers. Method embodiments disclosed herein below can be used to determine a base power level (BPL). This BPL can be used as a reference point for setting up individual production devices. The BPL can be used to set up laser devices so that such devices can demonstrate optimum yield. For example, by adjusting the window W value (which is selected to accommodate the optical link budget, reliability, and yield) the window W value can be selected to maximize yield. Moreover, the window W value can be selected to increase the reliability and reliability stability of the diodes. For example, a given population of diodes can be set to have similar operating currents which results in a family of diodes having relatively similar operational lifetimes (reliability). Thus, for a given production run a high degree of reliability stability can be provided. All of these characteristics can be accommodated while incorporating previously determined laser performance information, previously determined coupling efficiency information, and user specified performance parameters. The determination of the BPL enables a laser device to be set up using the previously obtained data model information while still meeting the desired laser performance specifications. Additionally, embodiments of the invention include methods for adjusting laser optical output power to compensate for the effects of temperature changes.

One method of determining a base power level (BPL) for a laser emitter to be coupled with an optical fiber in a fiber optic link is described. A particularly advantageous feature of the disclosed embodiment is that same BPL applies to all lasers in the characterized group of lasers and does not require any measurements of the particular laser emitter at issue. Previously obtained laser performance information, derived from a sampling of a population of lasers, is provided. Example methods for obtaining such laser performance information have been described herein. It will be appreciated by those having ordinary skill in the art that many other methods of data collection and laser characterization can be utilized in accordance with the invention. This information provides laser performance information that models laser performance characteristics and provides useful statistical information that can be used to further characterize laser performance. The particular laser being set up is of like kind to that described by the previously obtained laser performance data (i.e., the laser being set up is substantially similar to the lasers described by the laser performance data).

Additionally, previously obtained coupling efficiency information is provided. The coupling efficiency information can include statistical information concerning the coupling efficiency of the lasers to an optical fiber in an optical link. In general, the coupling efficiency information concerns coupling between laser emitters and optical links that are of a like kind to the laser and optical link being set up in accordance with the principles of the invention. Coupling efficiencies are commonly on the order about 4 dB (decibel) ±1 dB. However, the inventors contemplate that the invention can be practiced with a wider range of coupling efficiencies.

Also, a predetermined set of user specified performance parameters are provided. Such user specified performance parameters can be used to encompass a number of system parameters and laser operating parameters. Such user specified performance parameters can include a predetermined value for ER (extinction ratio). Such ER's are generally greater than about 9 dB. Another user specified performance parameter includes the power window W described hereinabove. One example of a useful power range for such a window W is about 1 dB. Another parameter is a power adjustment coefficient (PAC) which is an adjustable factor having a value between −1.0 and 1.0 that can be adjusted by a user to increase production yield. Another parameter is a modulation current adjustment coefficient ($I_{mod\ adj}$) which is an adjustable factor that can be fine-tuned by a user to selectively reduce modulation currents at higher temperatures to prevent premature "burn-out" of the laser (i.e. increase reliability) or increase the production yield (i.e. increase the numbers of laser diodes generating optical outputs that meets requirements). Another user specified performance parameter includes a predetermined operational temperature range over which the laser is intended to operate. In one embodiment, such a range encompasses −10° C. to about +90° C. Of course, as is readily apparent to persons having ordinary skill in the art, other temperature ranges can be used to encompass laser performance over wider and narrower operating ranges. Additionally, a starting or initial power value ($P_i$) can be provided by the user to begin calculations of a suitable base power level. The inventors point out that although selected values for some of the above parameters have been provided, the present invention can be practiced using other values for the specified parameters. Also, the invention can be practiced using other user specified performance parameters (some of which are further explained hereinbelow).

Once the above information is provided, an appropriate value for base power level can be calculated. This calculation incorporates the laser performance information (determined from the statistical models), the coupling efficiency information, and at least some of the performance parameter information.

FIG. 7($a$) is a simplified flow diagram that illustrates one embodiment for calculating base power level (BPL) and generating a table of temperatures and associated current values that can be used to regulate laser performance over a range of temperatures in accordance with the principles of the invention. The BPL is an estimate of a best-case average power level for a population of laser devices. It is a baseline value onto which other measurements and calculations can be referenced. The depicted flow diagram 700 discloses one generalized method of determining a BPL and generating a table of current values that are associated with temperature. Data models of laser performance with respect to temperature are provided (Step 701). Methods of collecting such data are well described in the foregoing paragraphs and shall not be reiterated here. The inventors contemplate that persons having ordinary skill in the art can readily apply the teachings set forth herein to generate data models in accordance with the principles of the invention. Also, the inventors contemplate that those of ordinary skill can perform statistical analysis to data so acquired in order to generate more elaborate data models of laser performance. A base power level is then determined using information generated by the data model and predetermined set of user specified performance parameters (Step 703). It is then determined whether a laser having the aforementioned base power level (BPL) will satisfy a set of pre-specified operating parameters (Step 705). Where it is determined that the BPL does not satisfy the set of pre-specified operating parameters (Step 706), adjustments are made to the calculations used to generate the BPL value and Step 703 is repeated using the adjustments to the calculations. This loop continues until the BPL is satisfactory. Where it is determined that the BPL does satisfy the set of pre-specified operating parameters (Step 707), a relation between temperature and associated current values is determined (Step 709). Commonly, this determination comprises a selection of appropriate set of current values together with associated temperatures and storing such values, for example in a table. Additionally, in some implementations, a relation between a target average power level and temperature is also determined (Step 710). This relationship can be stored or determined during operation. This information can be used to regulate laser performance of any particular laser (chosen from among the population of lasers) over a range of temperatures.

Figure 7A:
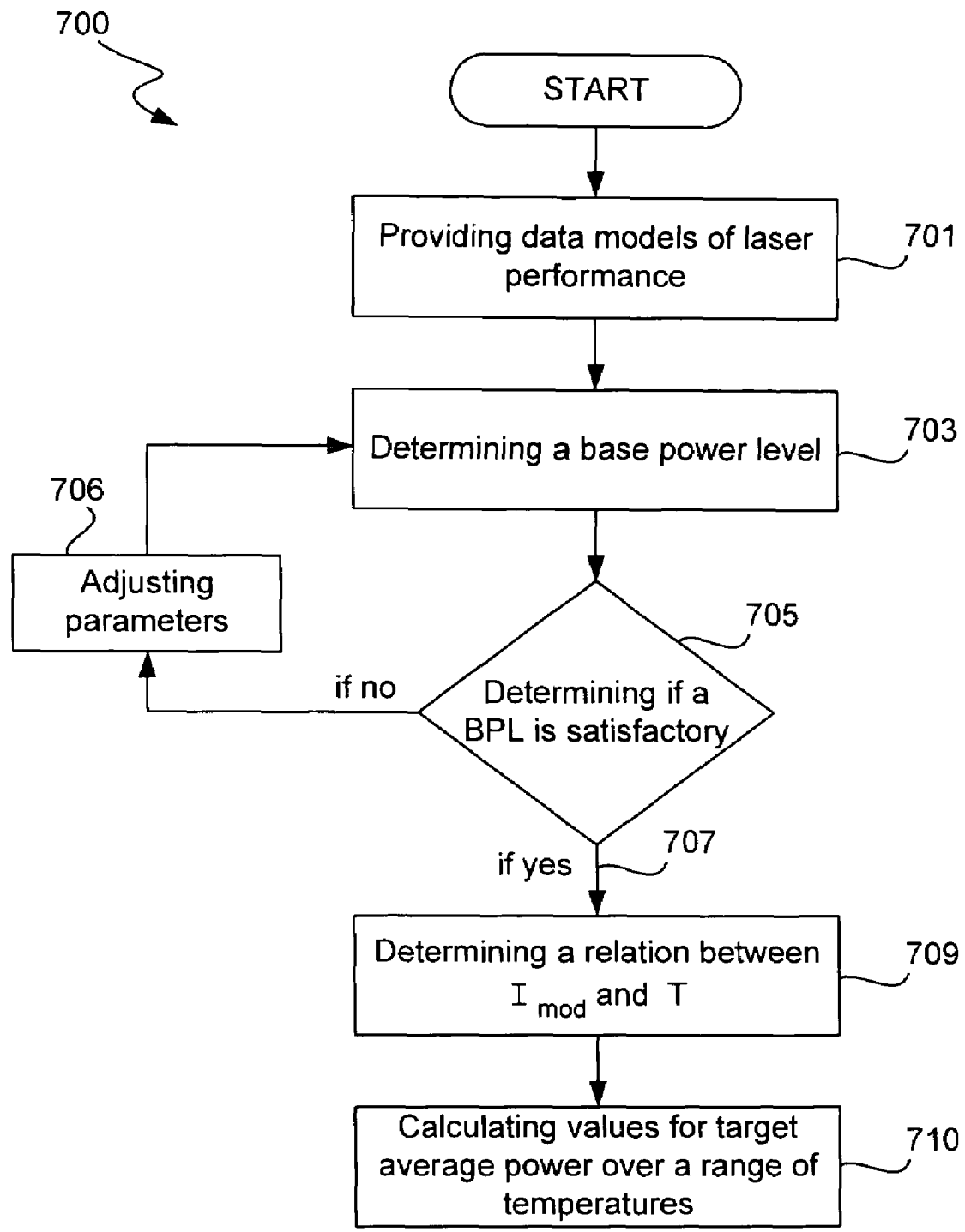
FIG. 7($a$) is a flow diagram illustrating a method embodiment for determining a base power level (BPL) and generating a table of $I_{mod}$ v. temperature in accordance with the principles of the present invention.
Figure 7B:
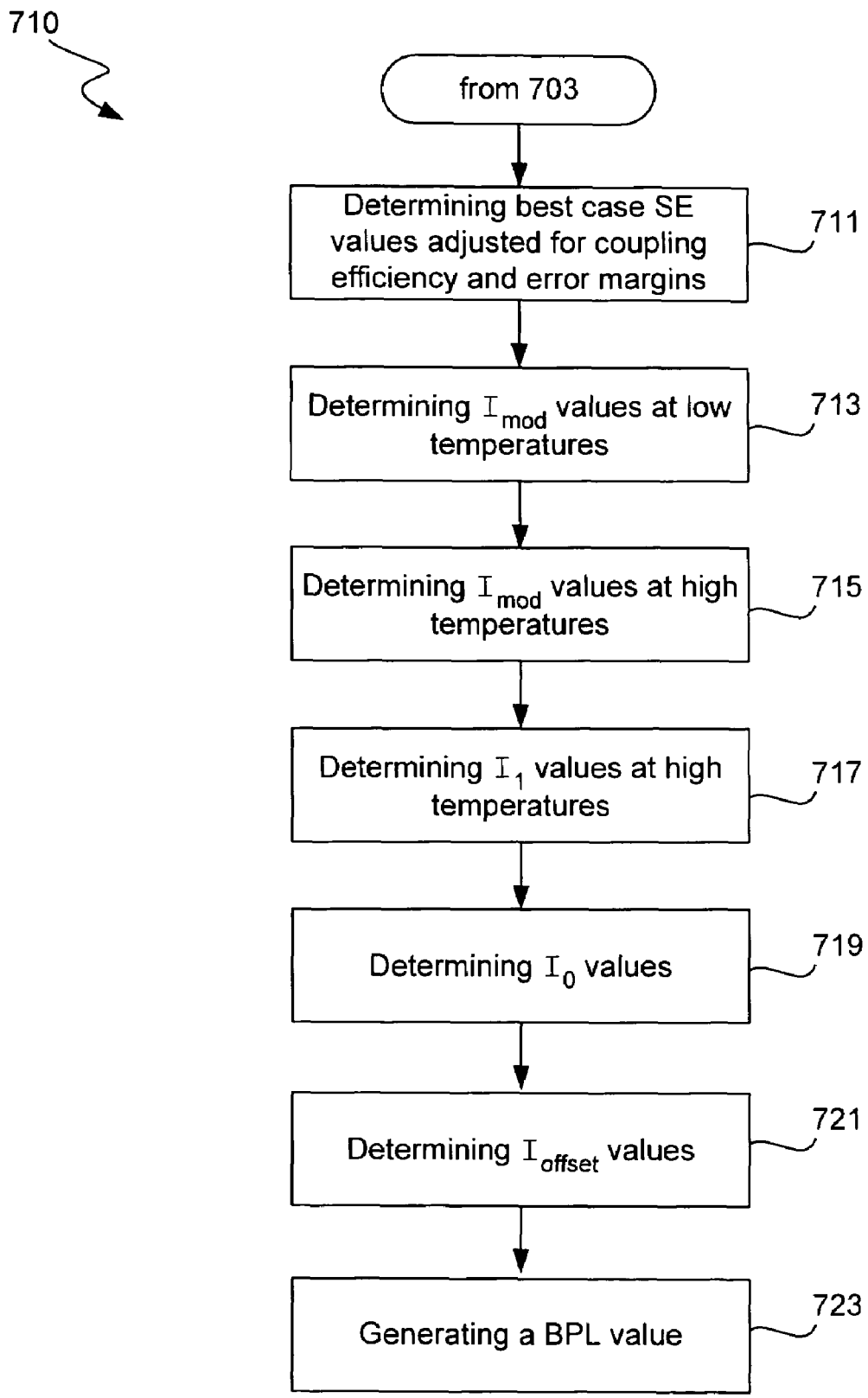

FIG. 7(b) is a simplified flow diagram 710 depicting an approach for determining the BPL. In general the process includes: determining modulation current values ($I_{mod\ at\ low\ T}$) associated with a lowest temperature in a range of temperatures; determining modulation current values ($I_{mod\ at\ high\ T}$) associated with a highest temperature in the range of temperatures; determining logical "1" current values ($I_{1\ (at\ high\ T)}$) associated with the with a highest temperature in the range of temperatures; and determining the base power level using information associated with: the determination of $I_{mod\ at\ low\ T}$; the determination of $I_{mod\ at\ high\ T}$; and the determination of $I_{1\ (at\ high\ T)}$.

An example of one process for determining a modulation current value ($I_{mod\ at\ low\ T}$) associated with a lowest temperature in a range of temperatures is described with respect to Steps 711 and 713. A range of best-case (low temperature) coupled slope efficiencies is determined (Step 711). These values are then used in calculations of $I_{mod\ at\ low\ T}$ (Step 713).

Figure 8A:
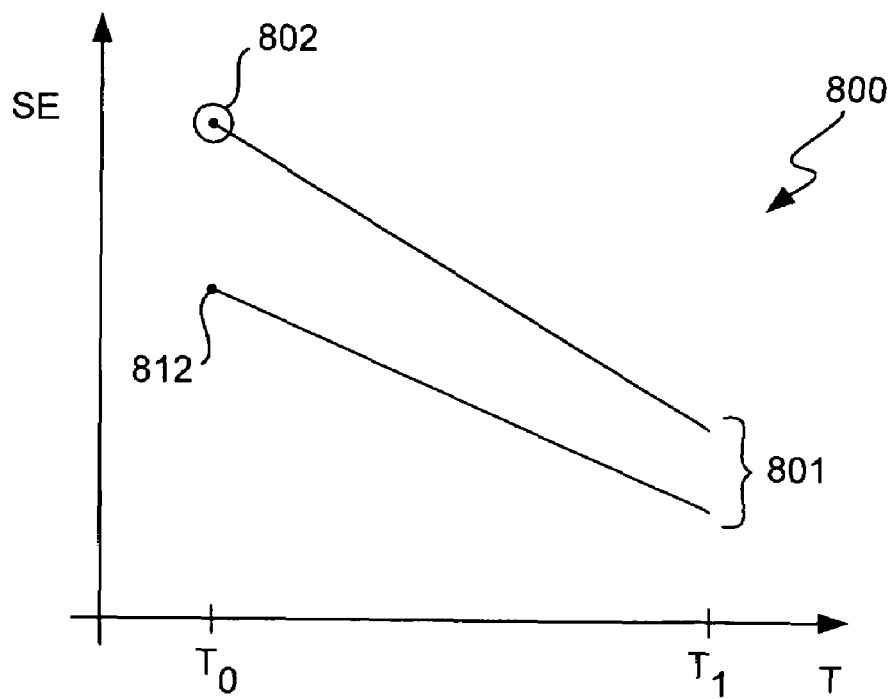
FIG. 8($a$) is a simplified graphical depiction of the slope efficiency data as compared to temperature that can be used to facilitate certain aspects of the invention.
Figure 8B:
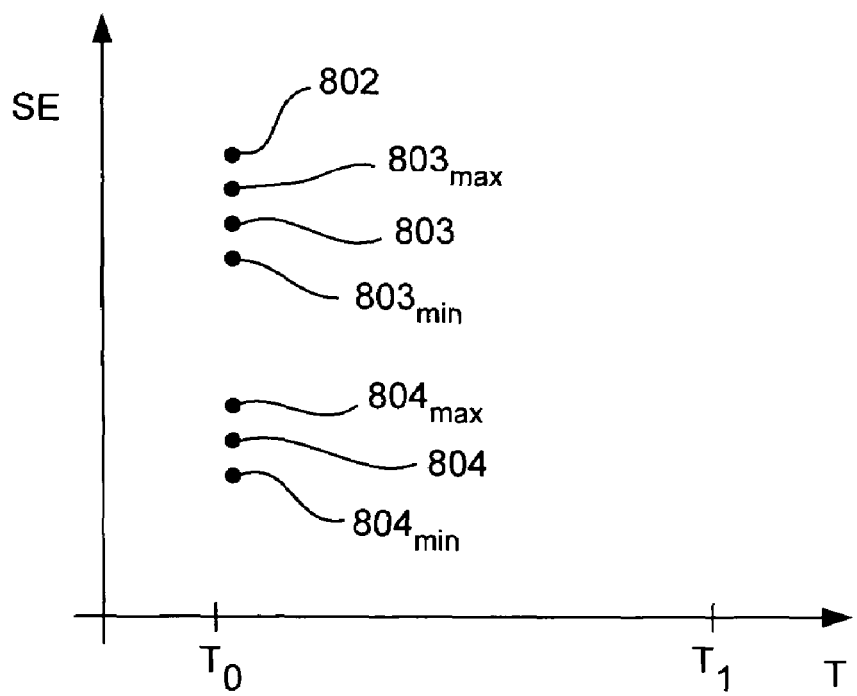

A determination of a range of best-case (low temperature) coupled SE values is described as follows. A first value for best-case slope efficiency (SE) values is determined using a data model describing SE as a function of temperature. Such models and methods for generating such models have been previously described herein (for example, see the descriptions concerning FIG. 5). Added reference is hereby made to FIG. 8(a) which is a simplified schematic depiction of a data model 800 of temperature versus slope efficiency (SE). Such a model is generated using data collected from a test population of measured lasers taken from a larger population of manufactured lasers of a like kind. The SE of each tested laser is graphed with respect to temperature over a defined temperature range. To defines the low end of the temperature range and $T_1$ defines the high end of the temperature range. The temperature range is typically the operational temperature range for the laser. Commonly, $T_0$ is defined as the lower end of the operational range of temperatures (e.g., about −10° C.), with $T_1$ being defined at the upper range of operational temperatures (e.g., about 90° C.). The SE at each temperature is determined for each laser tested. Generally, the behavior of such lasers is linear. FIG. 8(a) depicts a pair of example SE curves 801. Using the provided data model, a best-case SE at low temperature is determined. The best-case SE is that SE having the highest value. For example, the data model 800 is used to determine that data point 802 is the best case SE value (generally the highest SE values are found at the lowest temperature). A worst-case SE value 812 at $T_0$ is also depicted, showing the worst performance of the measured population of lasers. Additionally, a data model of coupling efficiency (CE) between a laser and an associated optical link is also analyzed. Analysis of the CE model can be used to determine a minimum and a maximum coupling coefficient for the coupling of lasers and the optical link (i.e., the effects of the best case coupling and the worst case coupling). Once the best and worst case coupling coefficients are determined, they are applied to the best-case SE value (i.e. 802) to determine a pair of effective SE values at low temperature. These are depicted in FIG. 8(b) which shows a maximum effective SE value 803 and a minimum effective SE value 804. Additionally, as touched upon hereinabove, the measurements of temperature and SE used to generate the data model 800 are subject to some error margin. The error margin for each SE determination can be applied to each of the effective SE values (803, 804) to generate minimum and maximum "actual" values for each of the effective SE values (803, 804). Thus, four values for "actual" $SE_A$ are generated (e.g., $803_{max}$, $803_{min}$, that are associated with maximum effective SE value 803; $804_{max}$, $804_{min}$, that are associated with minimum effective SE value 804). These values cover the range of values for an optimal SE value delivered by a laser coupled to an optical fiber for the system and represents a range of optical power deliverable by the system. These actual values are used elsewhere in the method.

Values for modulation current ($I_{mod\ at\ low\ T}$) associated with a lowest temperature in a range of temperatures are determined using the values for "actual" $SE_A$ ($803_{max}$, $803_{min}$, $804_{max}$, $804_{min}$,) in conjunction with a predetermined set of user specified performance parameters (Step 713). The following equation is suitable for generating $I_{mod\ at\ low\ T}$ values in accordance with the principles of the invention.

$$I_{mod\_at\_low\_T} = \frac{2P_i(ER-1)}{SE_A(ER+1)} \qquad \text{Eqn. 5}$$

$P_i$ is a user provided initial power estimate that is generally in the range of about 0 mW (milliwatts) to about 3 mW. Additionally, $P_i$ can be adjusted by the user if desired. Also, interim values BPL generated by Steps 710-723 of FIG. 7(b) can be input here as $P_i$ where iterative processes are used to determine BPL. ER refers to the extinction ratio described hereinabove. The user specifies the desired ER. As needed the ER value can be adjusted. Thus, for this calculation, the predetermined set of user specified performance parameters include $P_i$ and ER. Additionally, $SE_A$ represents the "actual" SE values ($803_{max}$, $803_{min}$, $804_{max}$, $804_{min}$,) determined hereinabove (e.g., at 711). The inventors point out that it is preferable to use only two $SE_A$ values to calculate $I_{mod}$ values (alternatively four $SE_A$ values can be used in accordance with the principles of the invention). For example, two $SE_A$ values ($803_{min}$ and $804_{min}$) to calculate the $I_{mod\ at\ low\ T}$ to reduce the amount of calculation thereby generating two (2) values for $I_{mod\ at\ low\ T}$.

Returning to FIG. 7(b), a determination of modulation current values ($I_{mod\ at\ high\ T}$) associated with a highest temperature in the range of temperatures is made (Step 715). Values for modulation current ($I_{mod\ at\ high\ T}$) associated with a highest temperature in a range of temperatures are determined using the calculated values for $I_{mod\ at\ low\ T}$ in conjunction with a predetermined set of user specified performance parameters. The following equation is suitable for generating $I_{mod\ at\ high\ T}$ values in accordance with the principles of the invention.

$$I_{mod\_at\_high\_T} = I_{mod\_at\_low\_T} * (1 - TC*(T_1 - T_0)) \qquad \text{Eqn. 6}$$

$I_{mod\ at\ low\ T}$ represents the low temperature modulation current values determined in Step 713. One of the user specified performance parameters is temperature range ($T_1$-$T_0$). $T_1$-$T_0$ represents the operational range of temperatures over which the laser is expected to perform. In one example, the high temperature $T_1$ is about 90° C. and the low temperature $T_0$ is about −10° C. with a temperature range of about 100° C. TC is a slope efficiency temperature coefficient (TC) that describes the how SE changes over temperature. TC values are empirically determined using the previously described model of SE v. temperature. Statistical analysis of SE v. temperature models can be used to determine TC values. Generally, SE decreases with respect to increasing temperature so TC values are typically negative. For VCSEL lasers, TC values typically range from about −0.3%/° C. to about −0.5%/° C. over the specified temperature range (e.g. −10° C. to 90° C.). In the Eqn. 6 calculation, a maximum observed TC value ($TC_{MAX}$) is used (for example, a TC value of about −0.3%/° C.) so that the most efficient laser diode at high temperature is used in the BPL calculation. This $TC_{MAX}$ value can be statistically determined using the data model generated using observed measurements of SE and temperature. Using the above-described process, two (2) values can be generated for $I_{mod\ at\ high\ T}$ with each such value being associated with a corresponding value for $I_{mod\ at\ low\ T}$.

Continuing with the process depicted in FIG. 7(b), a determination of logical "1" current values ($I_{1\ (at\ high\ T)}$) (associated with the highest temperature $T_1$ in the range of temperatures) is made (Step 717). One value for $I_{1\ (at\ high\ T)}$ is calculated for each value of $I_{mod\ at\ high\ T}$ calculated at Step 715 described above. The following equation is suitable for calculating $I_{1\ (at\ high\ T)}$ values in accordance with the principles of the invention.

$$I_{1(at\_high\_T)} = \frac{P_{avg\_at\_high\_T}}{SE_B} + I_{th(at\_high\_T)} + \frac{I_{mod\_at\_high\_T}}{2} \qquad \text{Eqn. 7}$$

$P_{avg\ at\ high\ T}$ is a power value related to the user provided initial power estimate $P_i$. $P_{avg\ at\ high\ T}$ is determined from $P_i$ using the previously described power range window W. Here, the window W is used as a user defined boundary condition that defines the range of power variation for average power over an operational temperature range. As used here, the window W value is subtracted (in dB or dBm scale) or proportional reduced from the $P_i$ value to determine $P_{avg\ at\ high\ T}$.

Figure 8C:
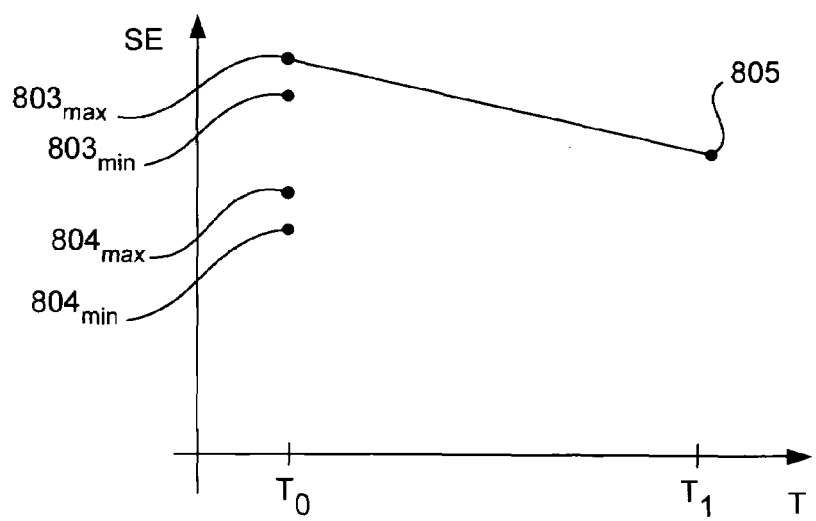

$SE_B$ values can be calculated as follows. For each of the SE values determined at low temperature (e.g., $SE_A$ values $803_{max}$, $803_{min}$, $804_{max}$, $804_{min}$,) an associated SE value ($SE_B$) is generated at high temperature $T_1$. These $SE_B$ values each incorporate the effects of coupling efficiency and SE error margins. This can, in one embodiment, be done by deriving the $SE_B$ values from the previously determined $SE_A$ values and the SE data model. In such a case, the $SE_B$ values are calculated using a $SE_A$ value and a best case TC value. FIG. 8(c) illustrates one example of how a $SE_B$ value can be calculated. The graphical depiction of FIG. 8(c) is similar to that of FIG. 8(b). Using, for example, the $SE_A$ value corresponding to point $803_{max}$, a best-case TC value (for example, about −0.3%/° C.) is used to extrapolate from point $803_{max}$ to an SE value 805 corresponding to the highest temperature ($T_1$) in the range temperatures. An $SE_B$ value is determined for each corresponding $SE_A$ value.

Figure 8D:
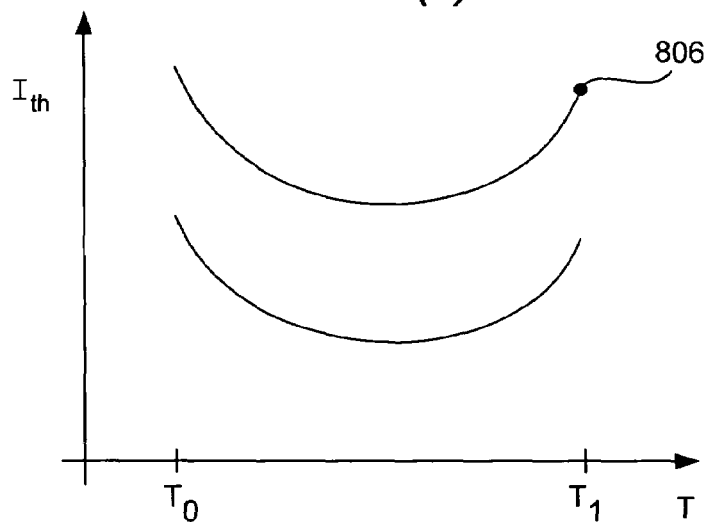

$I_{th\ (at\ high\ T)}$ represents a threshold current value taken from a data model of threshold current versus temperature. In one embodiment, the worst-case (highest) threshold current value is used. The worst-case $I_{th}$ is an $I_{th}$ having the highest $I_{th}$ value. Using the provided data model (e.g., as depicted in FIG. 8(d)), a worst-case value for $I_{th}$ can be determined. FIG. 8(d) is a graph of threshold current ($I_{th}$) versus temperature. Typically, this value is determined at either end of the temperature range. But, as used here the high temperature ($T_1$) value for $I_{th}$ is used. Thus, a worst-case high temperature $I_{th}$ value is depicted at point 806. Additionally, the values of $I_{mod\ at\ high\ T}$ are the values calculated at Step 715 described above.

The calculations should generate four (4) values for $I_{1\ (at\ high\ T)}$. Each $I_{1\ (at\ high\ T)}$ value is calculated using an associated value of $I_{mod\ at\ high\ T}$ and an associated $SE_B$ value. Thus, for each $I_{mod\ at\ high\ T}$ value calculated (at Step 715) a specific value for $SE_B$ is calculated, and from these two values (as well as the $P_{avg\ at\ high\ T}$ and $I_{th\ (at\ high\ T)}$) an associated value for $I_{1\ (at\ high\ T)}$ is calculated. For example, a first value for $I_{1(at\ high\ T)}$ is calculated from $I_{mod\ at\ low\ T}$ (associated with point $803_{min}$ (also referred to as $SE_{A(1)}$ in this example), $I_{mod\ at\ high\ T}$ (derived from the $I_{mod\ at\ low\ T}$ value which we just calculated), and $SE_{B(1)}$ derived from SE point 803 as described in FIG. 8(b) using SE data model and positive SE error margin (point 805 in FIG. 8(c)). The second $I_{1(at\ high\ T)}$ is calculated from $I_{mod\ at\ low\ T}$ associated with $SE_{A(1)}$, $I_{mod\ at\ high\ T}$ (derived from $I_{mod\ at\ low\ T}$ which we just calculated), and $SE_{B(2)}$ derived from SE point 803 using SE data model and negative SE error margin. Then calculations are repeated for third and fourth values of $I_{1(at\ high\ T)}$ for SE point 804 and SE error margins. This is repeated for each $I_{mod\ at\ high\ T}$ value, thereby generating four (4) $I_{1\ (at\ high\ T)}$ values.

Returning to FIG. 7(b), these foregoing derived values are used to determine the BPL in Steps 719-723. This includes a determination of zero-level bias current $I_0$ as determined at high temperature (Step 719). $I_0$ is the current bias used to establish a logical "zero" for the system. This can be can be determined using the following equation.

$$I_{0\_at\_high\_T} = I_{1(at\_high\_T)} - I_{mod\_at\_high\_T} \qquad \text{Eqn. 8}$$

Eqn. 8 can be used to generate four values for $I_{0\ at\ high\ T}$. Eqn. 8 illustrates one simple method for determining $I_{0\ at\ high\ T}$ by subtracting the $I_{mod\ at\ high\ T}$ values (determined at Step 715) from associated values for $I_{1\ (at\ high\ T)}$ (determined at Step 713).

Figure 8E:
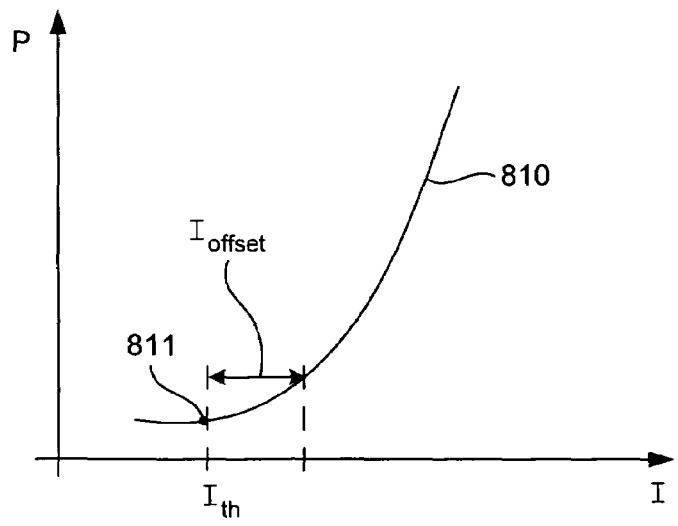

Appropriate offset current values ($I_{offset}$) are determined (Step 721). $I_{offset}$ is the difference between the laser diode threshold current $I_{th}$ and an associated zero-level bias current $I_0$. High values for $I_{offset}$ improve signal quality because they reduce jitter and demonstrate better rise and fall times for the optical signal produced by the laser. $I_{offset}$ is briefly illustrated with respect to FIG. 8(e) which depicts a potion of a power curve for a laser diode. As explained previously with respect to FIG. 6, the curve includes a linear portion 810 bending to a point 811 where virtually no light is produced by the diode. This point 811 corresponds to the threshold current $I_{th}$. A small offset or offset current $I_{offset}$ is generally added to the threshold current $I_{th}$ to improve laser performance. In accordance with an embodiment of the invention the offset current $I_{offset}$ value can be calculated using the measurements already made using the following equation.

$$I_{0\_at\_high\_T} - I_{th\_(at\_high\_T)} = I_{offset\_at\_high\_T} \quad \text{Eqn. 9}$$

Eqn. 9 can be used to generate four values for $I_{offset\ at\ high\ T}$ (Step 721). $I_{0\ at\ high\ T}$ is determined in Step 719. $I_{th\ (at\ high\ T)}$ is determined using the data model as described hereinabove with respect to Step 717. Each value for $I_{th\ (at\ high\ T)}$ is subtracted from an associated value for $I_{0\ at\ high\ T}$ to produce a corresponding value for $I_{offset\ at\ high\ T}$. The above calculations can produce four separate values for $I_{offset\ at\ high\ T}$ which are used in subsequent operations.

The aforementioned process operations provide a foundation upon which a calculation of base power level can be determined (Step 723). The following equation is suitable for generating BPL values in accordance with the principles of the invention.

$$BPL = [P_i - \text{Min}(I_{offset\_at\_high\_T}; 0)^* SE]^* PAC \quad \text{Eqn. 10}$$

$P_i$, as described previously, is a user provided initial power estimate (typically in the range of about zero to 3 mW). Also, $P_i$ values can be adjusted by the user if desired. Also, interim BPL values generated by previous iterations of the process (Steps 710-723) can be input here as a new value for $P_i$ in a continuing iterative process used to determine BPL. The $I_{offset\ at\ high\ T}$ values are those values generated in Step 721. Thus, there are four (4) such $I_{offset\ at\ high\ T}$ values. Eqn. 10 uses Min($I_{offset\ at\ high\ T}$; 0) to represent a calculation whereby the values determined for $I_{offset\ at\ high\ T}$ (which can frequently be negative numbers) are compared with each other and with the value zero. The lowest value (zero or the value having the greatest negative magnitude) is then used in further calculations. The SE used is the best-case value for SE taken from a model of SE and temperature. Referring to FIG. 8(a) or 8(b), the SE value typically used is that represented by 802 which accounts for a modelled best-case SE value. The PAC is a Power Adjustment Coefficient that can be used to fine-tune the calculated power values to attain desired BPL. The PAC is a user specified performance parameter (generally having a value in the range of −1 to 1). Alternatively, the SE value can be an "actual" best-case value for SE taking in to account measurement errors, temperature variation, and coupling efficiency variation.

The combination of values for $P_i$, ER, and PAC needed to guarantee that the laser output signal meets pre-specified operational specifications is determined empirically. Because each of these factors (as well as other factors including, but not limited to $I_{th}$, SE values, TC values, ER, peak power, peak bias current, as well as other operating specifications) prioritize different laser operating parameters embodiments of the invention use iterative processes to determine values for these, and other, parameters to accomplish the necessary tradeoffs required to meet the pre-specified operational specifications for the laser output signal. To that end the BPL provides information used to determine the degree of optical attenuation needed for the final optical design. The process identified in FIGS. 7(a) (and 7(b)) are directed toward determining a set current and power values that manages the trade-off between all of these factors.

Returning to FIG. 7(a), once a value for BPL is determined in Step 703 (e.g., using Steps 711-723), it must be determined if the BPL presents a satisfactory solution (Step 705). In one embodiment, the process determines if the BPL is satisfactory by determining if a laser incorporating the BPL value can satisfy the required laser operating specifications over a range of temperature conditions.

Figure 7C:
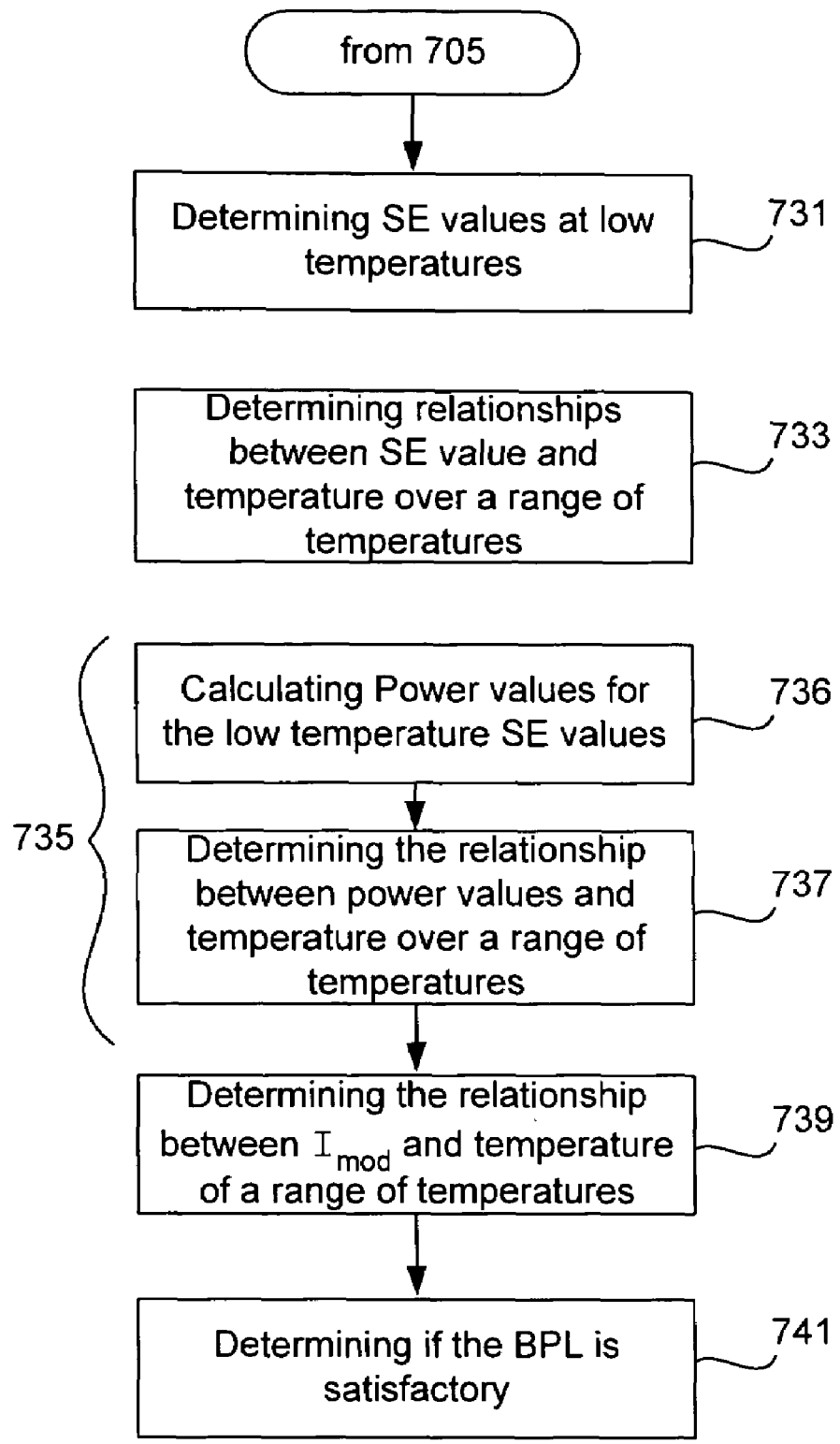

One embodiment used for determining if the BPL value is satisfactory is described with respect to FIG. 7(c). The process includes an operation for determining high and low SE values at low temperature (Step 731). An operation for calculating SE variation curves (that describe boundaries for SE versus temperature curves) associated with the high and low SE values (as determined in Step 731) is performed (Step 733). A relation between power and temperature is determined (Step 735). A relation between modulation current and temperature is determined (Step 739). A relationship between ER and temperature is calculated and used to determine if the BPL is satisfactory (Step 741).

Figure 9A:
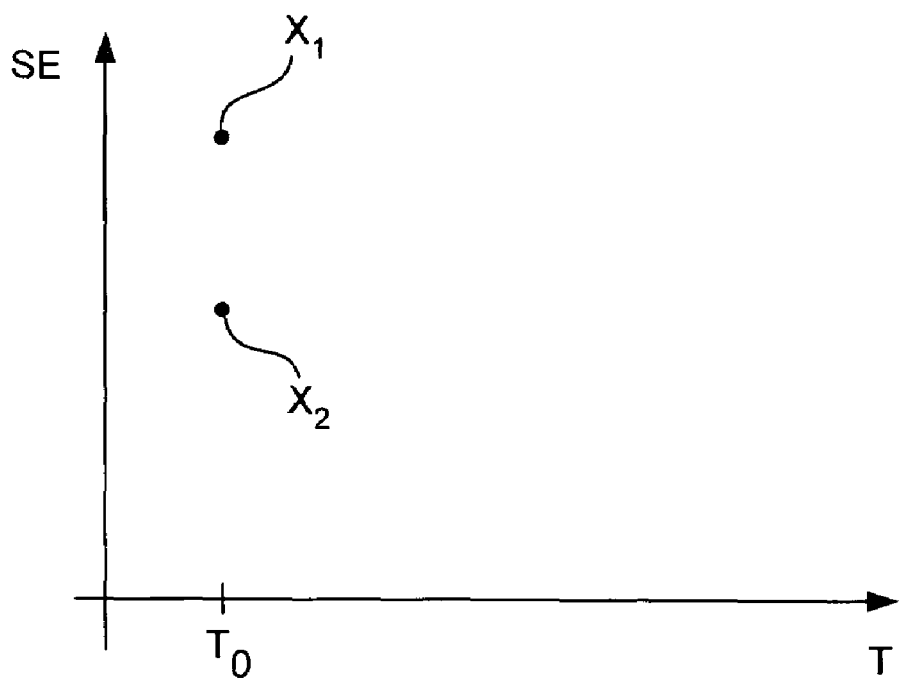
FIGS. 9($a$) and 9($b$) are depictions of relationships between SE and temperature for laser devices constructed in accordance with the principles of the invention.

One embodiment of an operation for determining high and low SE values at low temperatures (Step 731) is described as follows. Reference is made to FIG. 8(a). In FIG. 8(a), the best-case SE (highest) value 802 is shown for a laser population, as is a worst-case SE (lowest) value 812. Such values of best-case SE ($x_1$) and worst-case SE ($x_2$) at are depicted as at FIG. 9(a). These values ($x_1$, $x_2$) are typically, calculated at the lowest temperature ($T_0$) in the laser operating range.

Figure 9B:
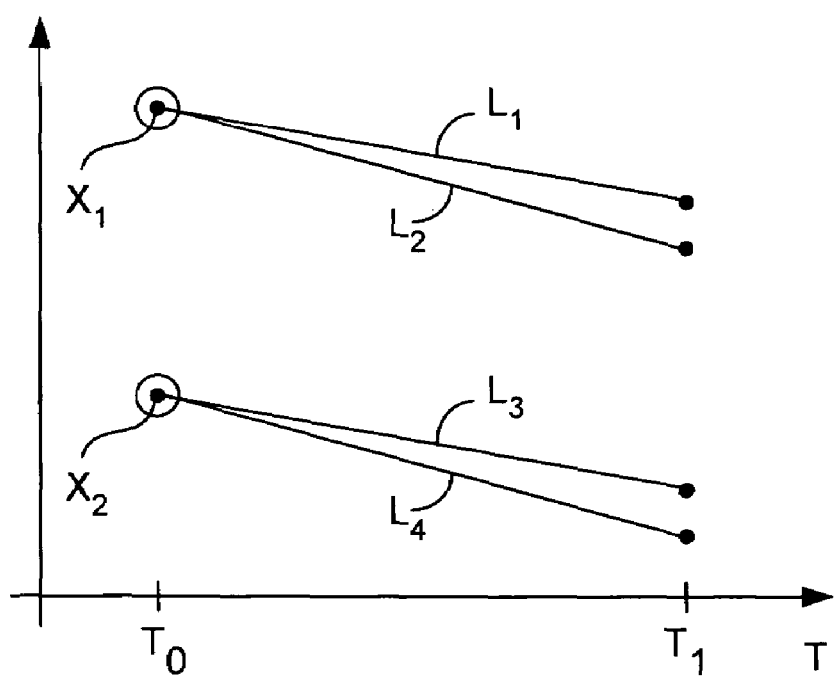

For each SE value ($x_1, x_2$) SE variation curves are calculated (Step 733). As depicted, for example, in FIG. 9(b), these SE variation curves describe boundaries for SE versus temperature curves. In one embodiment, these SE variation curves are determined by using best case and worst case temperature coefficients (TC) determined from, for example, a data model of SE versus temperature. TC describes the variation in SE values over temperature. Such values can be determined from data models using statistical analysis techniques known to those having ordinary skill in the art. Additionally, best case and worst case values for TC can determined. Using these TC values a best case and worst case SE variation curve can be generated for each SE value ($x_1, x_2$). These SE variation curves are depicted by $L_1$, $L_2$, (associated with best case SE value $x_1$) and $L_3$, $L_4$ (associated with worst case SE value $x_2$). These SE variation curves provide a description of the variation of SE with temperature over the temperature range ($T_0$-$T_1$).

A relation between power and temperature is determined (Step 735). Typically this is accomplished in two steps (Steps 736 and 737). In one implementation, power values are associated with the SE values ($x_1, x_2$) (Step 736) and then a relationship between power and temperature can be determined (Step 737). One embodiment of the invention makes use of the previously determined BPL values and the following equation.

$$P_{calc}(M) = BPL * \frac{M}{SE_{best}} \quad \text{Eqn. 11}$$

The above Eqn. 11 can be used to determine the power values that are associated with the SE values ($x_1, x_2$) (Step 736). $P_{calc}(M)$ is a calculated power value that is used to determine whether previously calculated BPL values are satisfactory. BPL is the base power level calculated in Step 703 (e.g., Steps 711-723 of FIG. 7(b)). $SE_{best}$ is the best SE value obtained from the SE data model at low temperature (ergo the highest SE value). M represents the selected best and worst SE values (i.e. $x_1$ and $x_2$) mentioned above. In the case of $x_1$, $P_{calc}(M)$ equals $P_{x1}$ and is equal to BPL. For $x_2$, $P_{calc}(M)$ is $P_{x2}$ and is equal to some value less than BPL.

From these power values $P_{x1}$ and $P_{x2}$, relationships between power and temperature can be determined (Step 737). Specifically, a relationship between power and temperature is determined for both $P_{x1}$ and $P_{x2}$. This relationship can be calculated over the operational temperature range (from $T_0$ to $T_1$) using the pre-specified power window W. For example, using $P_{x1}$ as the maximum power value in a first power range, W is subtracted (in dB scale) from $P_{x1}$ to determine a minimum power value in the first power range. Power values can be interpolated over the temperature range (from $T_0$ to $T_1$) from the maximum power value $P_{x1}$ to the minimum power value. A second power range can be determined in the same way using $P_{x2}$ as the maximum power value, using W, and the same temperature range. Thus, two "curves" encapsulating a relationship between optical power and temperature are generated.

Additionally, a determination of the relationship between modulation current and temperature is made (Step 739). Such a relationship is embodied in the following equation.

$$I_{mod}(T) = \frac{I_{mod}\max}{[1 - TC_{MAX} * I_{mod\_adj} * (T_1 - T)]} \quad \text{Eqn. 12}$$

$I_{mod}$ max is a baseline modulation current value against which other values are calculated. Typically, $I_{mod}$ max is the modulation current value determined at a high temperature. A method of calculating two such values is previously disclosed at Step 715 and Eqn. 6. $TC_{MAX}$ is the best-case SE temperature coefficient (the TC value derived from the SE v. temperature data model having the shallowest negative slope e.g. $-0.3\%/°$ C. with the same example in Step 713 and Eqn. 6). $I_{mod\_adj}$ is a user specified performance parameter. This value can be varied between 0 and 1 to adjust the modulation current over temperature. Increasing $I_{mod\_adj}$ decreases modulation currents at low temperatures thereby reducing instantaneous driving current and also having the effect of reducing the ER. Setting $I_{mod\_adj}$ to zero is a special case that reduces the complexity of the driving circuitry because $I_{mod}$ will be constant over temperature. The temperature values (T) are subtracted from the highest temperature $T_1$ in the operational range (e.g., about 90° C.). Thus, values for $I_{mod}$ (T) are determined for each temperature T in the operational range to obtain a relationship between modulation current and temperature.

Determining Whether the BPL is Satisfactory

Using the information previously obtained, the BPL is tested to determine whether the calculated BPL is satisfactory (Step 741). This is done by checking to see if pre-specified operating parameters are satisfied for each power, modulation current, and SE value over the range of operational temperatures. One particularly useful, but not exclusive, pre-specified operating parameter is the extinction ratio (ER). If the ER specifications are met for each power, modulation current, and SE value over the range of operational temperatures. In one implementation, this can be done using the following equation.

$$ER(T) = \frac{2P(T) + I_{mod}(T) \cdot SE(T)}{2P(T) - I_{mod}(T) \cdot SE(T)} \quad \text{Eqn. 13}$$

The above equation is evaluated to determine if the ER is satisfactory for all four related cases. The $I_{mod}$ (T) values are those calculated hereinabove using Eqn. 12. P(T) values have been previously determined (e.g., at Step 737) to generate two relationships between temperature and power. Additionally, for each of the two power relationships P(T), there are two relationships of slope efficiency with temperature (e.g., $L_1$, $L_2$, $L_3$, $L_4$) as previously determined at Step 733. Thus, for each $I_{mod}$ (T) there are four solutions for ER. Additionally, ER must be solved for every temperature in the range. If all the calculated values for ER meet the desired specification for ER (typically, 9 dB or greater) then the BPL value is satisfactory and no further adjustments or calculations need be made to BPL (Step 707).

However, if any of the calculated ER values are too low, at least some of the user specified performance parameters are adjusted (Step 706). The point of such adjustment is to produce a BPL that is satisfactory. Examples of adjustments to user specified performance parameters that can be made include, but are not limited to, changing the ER at Step 713 (e.g., at Eqn. 5); changing the initial power estimate $P_i$ at Step 713 (e.g., at Eqn. 5), or alternatively using the BPL value just determined as a new value for $P_i$. By increasing either of those values higher final ER values can be obtained. Other approaches include adjusting the Power Adjustment Coefficient (PAC) at Step 723 (e.g., at Eqn. 9). Also, the $I_{mod\_adj}$ (modulation current adjustment coefficient) can be adjusted by the user. Such adjustments are typically, implemented at Step 739 (e.g., at Eqn. 12). Again, by increasing these values, a higher final ER value can be obtained. Additionally, the temperature range can be adjusted to fine-tune the results.

Additionally, the results obtained with the determined BPL can be tested against other laser operating parameters to determine the fitness of the BPL value. For instance, if is important to limit the maximum $I_1$ current (thereby preventing an excessive rate of laser diode burn-out) and/or limit average current (which relates to laser diode reliability and signal quality) a factor compensating for threshold current ($I_{th}$) can be incorporated into the process. In such determinations, the incorporation of a threshold current ($I_{th}$) factor can be used to determine a sufficient $I_{offset}$ (thereby improving the signal quality of the laser). Additionally, as can readily be appreciated by one of ordinary skill in the art, the BPL values can be qualified (determined satisfactory) by using limits on peak $I_1$, average current ($I_{avg}$), optical signal quality, power consumption performance associated with the BPL values. Another example qualifying a BPL (i.e., determining if a BPL is satisfactory) is described hereinbelow.

Figure 7D:
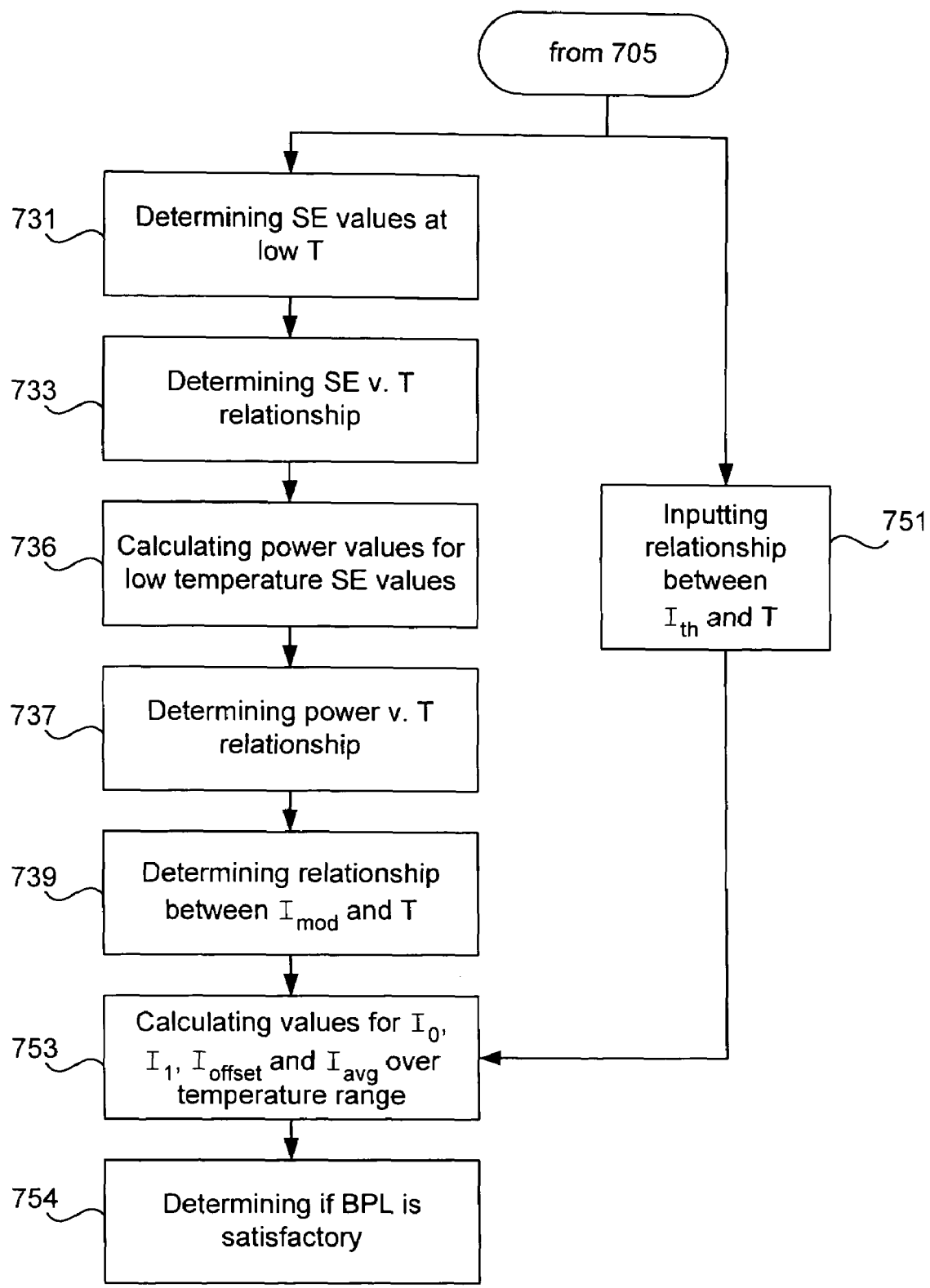

The process is essentially the same as described in FIGS. 7(a)-7(c) with a few modifications which are explained with reference to FIG. 7(d), which describes another embodiment capable of qualifying a BPL. The Steps 731-739 of FIG. 7(d) are essentially the same as described in the previous discussion of FIG. 7(c). Additionally, corrections can be made to account for variations in the data models concerning temperature and threshold current ($I_{th}$). Such curves are depicted and described with respect to, for example, FIG. 4. For example, curve C1 is a "best-case" relationship (lowest current values) of threshold current ($I_{th}$) to temperature. Also, C2 is a "worst-case" relationship between threshold current ($I_{th}$) and temperature (wherein at any given temperature the threshold current ($I_{th}$) is the highest current value). Thus, these two curves proscribe the boundaries of threshold current ($I_{th}$) values and can be used in calculations of other current values. Consequently, this data models of the relationship between threshold current ($I_{th}$) and temperature are input at Step 751.

With further reference to FIG. 7(d) this information is used to calculate values for $I_1$, $I_0$, $I_{offset}$, and $I_{avg}$ (Step 753). Such values can be calculated, for example, using Eqns. 13.1-13.4. Additionally, as can readily be appreciated by one of ordinary skill in the art, the BPL values can be qualified (determined satisfactory) by using limits on peak $I_1$, average current ($I_{avg}$), optical signal quality, power consumption performance associated with the BPL values.

$$I_1(T) = \frac{P_{calc}(T)}{SE(T)} + I_{th}(T) + \frac{I_{mod}(T)}{2} \qquad \text{Eqn. 13.1}$$

$$I_0(T) = I_1(T) - I_{mod}(T) \qquad \text{Eqn. 13.2}$$

$$I_{offset}(T) = I_0(T) - I_{th}(T) \qquad \text{Eqn. 13.3}$$

$$I_{avg}(T) = \frac{I_1(T) + I_0(T)}{2} \qquad \text{Eqn. 13.4}$$

Using processes already described, values for BPL (Eqn. 10), $P_{calc}$ (Eqn. 11), and $I_{mod}$ (Eqn. 12) have been (or can be) calculated at each temperature over a temperature range. In conjunction with the values determined in Step 753 and Eqns. 13.1~13.4 the BPL can be qualified. Using Eqn. 13.1 as an example, at each temperature in the range the appropriate values (e.g., $P_{calc}$, SE, and $I_{mod}$) are plugged into Eqn. 13.1. Values for $I_1$ are calculated, once using the "best-case" temperature/$I_{th}$ curve (e.g., C1) and once using the "worst-case" temperature/$I_{th}$ curve (e.g., C2). These $I_1$ values are calculated for each temperature in the range of temperatures. If the calculated values at each temperature (using both cases of the temperature/$I_{th}$ curve) fall within the user specified parameters for $I_1$ (e.g., below some specified peak $I_1$ value) the BPL value is acceptable and can be used to determine target power values. In general, the $I_{th}$ boundary cases (best and worst cases) can be used to qualify a BPL using calculations of the ER (Eqn. 13), $I_1$ (Eqn. 13.1), $I_0$ (Eqn. 13.2), $I_{offset}$ (Eqn. 13.3) and $I_{avg}$ (Eqn. 13.4) for each Ith case and each SE case. Unsatisfactory BPL's can be modified and adjusted as described hereinbelow until the BPL satisfy the requirements.

Returning to FIG. 7(*a*), if the BPL is unsuitable, then the user specified performance parameters (e.g., $I_{mod\ adj}$ of Eqn. 12) are adjusted (Step 706). Such adjustment continues until a suitable BPL is achieved. When a suitable BPL is achieved (Step 707), modulation current values associated with temperature are determined (Step 709). Typically, two sets of modulation currents and associated temperatures are generated (e.g., using Eqn. 12). One set for each of the $I_{mod}$ max values determined in Eqn. 6. Commonly the $I_{mod}$ max values are those associated with the SE case selected in Step 713 (See, for example, the $SE_A$ depictions of FIG. 8(*c*), e.g., the SE values corresponding to $803_{min}$ with best coupling and $804_{min}$ with worst coupling). Once these two sets (of $I_{mod}$ v. temperature) are determined, one set is selected for implementation. This selection can depend on a variety of factors. In particular, the desired optical performance of the laser can be used to select the final relation between $I_{mod}$ v. temperature. For example, if the $I_{mod}$ max value associated with $804_{min}$ is selected the resultant laser generally exhibits better signal quality but generally requires higher bias currents and demonstrates reduced reliability. However, if the $I_{mod}$ max value associated with $803_{min}$ is selected the resultant laser generally exhibits requires lower bias currents and demonstrates better reliability but at the cost of reduced signal quality. Thus, the desired optical properties of the resulting laser play a role in the selection of the final relationship between $I_{mod}$ and temperature.

The selected relationship of modulation current to temperature can be stored to a memory device or other computer readable media and later be used for regulating laser performance behavior in the field. As explained above, the selected current and temperature data can be generated using, for example, Eqn. 12, and stored in memory. Thus, a modulation current value $I_{mod}$ is stored for each temperature. In one embodiment, the modulation current $I_{mod}$ information can be stored in a table with the associated temperature information to generate a look-up table that indexes $I_{mod}$ with temperature. This look-up table can be used to control the operation of a laser device selected from the relevant population of lasers. The laser device can include a control device that forms part of the laser emitter or the laser can be control externally using a look-up table not stored on the laser emitter. For example, the look-up table is stored on a computer along with appropriate laser drivers. Thus, the $I_{mod}$ can be continuously adjusted depending on the changing temperature of the laser. These foregoing embodiments are advantageous for a number of reasons. One particularly useful aspect of the invention is that the only required measurements are the initial measurements used to generate the data models. No active alignment measurements are required.

After the BPL and $I_{mod}$ are determined, a target average power level ($P_{target\ avg}$) is determined for each temperature. This parameter is determined for each specific device under production (DUP) using the following methodology. First an average power factor ($P_{DUP}$) factor is calculated for each specific device under production (DUP). The following relation can be used to accomplish this.

$$P_{DUP} = BPL_{final} * \frac{M_{DUP}}{SE_{best}} \qquad \text{Eqn. 14}$$

$BPL_{final}$ is the BPL value determined from (e.g., at Step 707 of FIG. 7(*a*)). $SE_{best}$ corresponds to the SE case corresponding to the $I_{mod}$ set selected in Step 709. This means that the SE value is obtained from the laser diode characterization data adjusted by best or worst coupling efficiency depending on the $I_{mod}$ selection. Therefore, the SE value is chosen from $804_{min}$ or $803_{min}$ depending on the $I_{mod}$ set selected. $M_{DUP}$ is the slope efficiency of the DUP at the lowest temperature (the best case scenario). Therefore, the $P_{DUP}$ is the average optical power level for the DUP at low temperature. Additionally, for each DUP, the average optical power level at each temperature (in a temperature range) can be calculated. This will generate a $P_{target\ avg}$ for each temperature in the range of operational temperatures to be used by the laser. This can be done, for example, by using the calculated $P_{DUP}$ value (corresponding to the power level $P_{target\ avg}$ at the lowest temperature in the range) and the power range window W. For each device, this derives a set of target average power levels ($P_{target\ avg}$) associated with each temperature. In one approach, the $P_{DUP}$ value and the power range window W can be used to interpolate $P_{target\ avg}$ values over the operational temperature range. This relationship between temperature and $P_{target\ avg}$ can be calculated and stored in a table. Alternatively, the relationship can be generated during operation of the laser is a microprocessor and a provided W value and a determined values of $P_{DUP}$ for the laser in question. Thus, the relationships between $P_{target\ avg}$ and $I_{mod}$ (over operational temperature range) data or behavior will be used to operate the optical transmitter.

Embodiments of the invention adjust the modulation current and calculated $P_{target\ avg}$ values to adjust the power level in order to accomplish temperature compensation. Both open loop and closed loop implementations can be used to effect temperature compensation. In a closed loop implementation the optical output power of the laser can be monitored and adjusted to obtain the desired laser power for the appropriate temperature. Once these values are calculated and stored, a temperature measurement is made and the appropriate bias currents are accessed and then input into the laser to obtain the desired optical output power.

Figure 10:
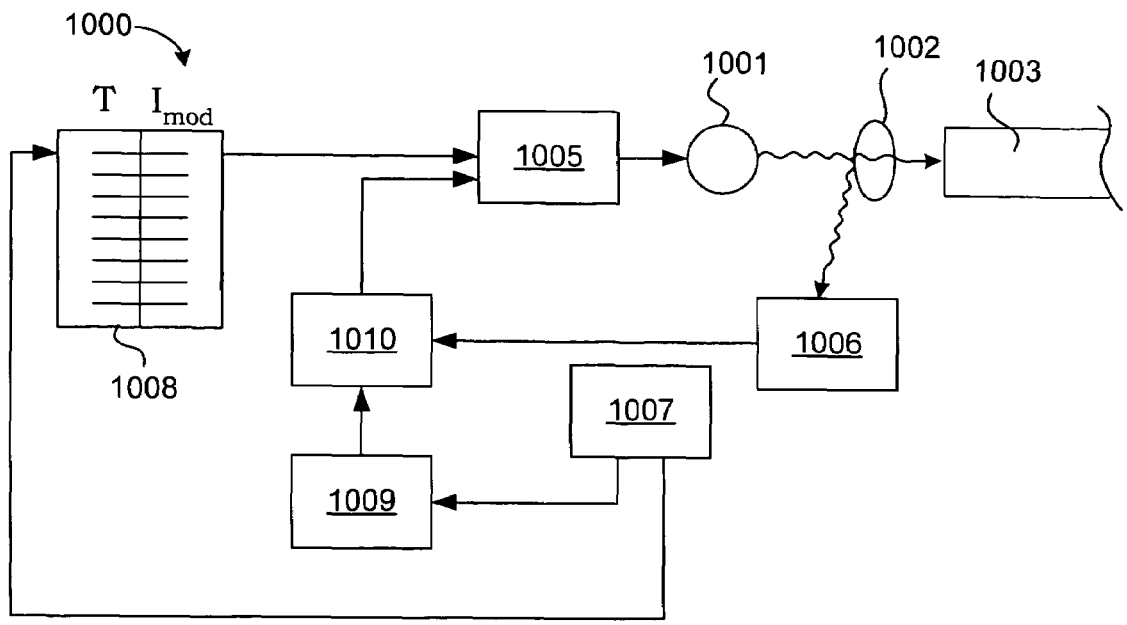
FIG. 10 is a simplified block depiction of a closed-loop optical link having a laser emitter laser and an associated optical fiber constructed in accordance with the principles of the invention.

FIG. 10 is a simplified block diagrams illustrating an apparatus embodiment suitable for accomplishing trim and compensation in accordance with the principles of the invention. FIG. 10 is a block diagram of an optical link 1000. The depicted embodiment includes a laser 1001 in optical communication with an associated optical fiber 1003. The depicted embodiment is a closed loop implementation. The apparatus includes a semiconductor laser 1001 (e.g., a VCSEL type laser, side emitting diode laser, or other related device) coupled to an optical fiber 1003. Typically, a lens element 1002 is used to improve the power transmission into the fiber. Electronic driver circuitry 1005 is used to drive the laser 1001. A monitoring element 1006 (typically, a diode device) is used to detect optical power produced by the laser 1001 and generate an associated monitor signal. Additionally, a temperature sensor 1007 is used to detect the laser 1001 temperature. A temperature compensation table 1008 is provided. Electronic circuitry for determining a suitable optical power level and generating an associated output signal is provided. This circuitry is referred to herein as operational power circuitry 1009 which produces an operational power output signal. This information can be stored as a table of temperature and associated values for $P_{target\ avg}$ and accessed by the circuitry 1009. Alternatively, the operational power circuitry 1009 can generate the appropriate temperature dependent values for $P_{target\ avg}$ using $P_{DUP}$ and W values as described hereinabove. Temperature compensation circuitry 1010 receives signal from the monitoring element 1006 and from circuitry 1009 (in the form of operational power output signals). The compensation circuitry 1010 adjusts the driving current (specifically $I_1$) provided to the laser 1001 to accommodate the changing temperature conditions (i.e., the driving current is increased or decreased until the output laser power equals the calculated $P_{target\ avg}$ (e.g., as determined from $P_{DUP}$ and W, as described above).

The temperature comparison table 1008 can be generated using the previously described $I_{mod}$ v. temperature calculations described herein (e.g., using Eqn. 12). Values for $I_{mod}$ at each temperature are stored in the table 1008. This table can be stored on the laser emitter device in a memory or remotely elsewhere in the optical system. At each temperature in an operational range of temperatures, the laser 1001 is turned on and the output laser power is increased or decreased by adjusting the $I_1$ current, which drives the optical power level for logic "1" ($P_1$), until the $P_{target\ avg}$ value corresponding to the selected temperature (calculated previously) is reached. This is easily accomplished using monitoring element 1006. Once the power level reaches the $P_{target\ avg}$ value an associated driving current $I_1$ is known. Once $I_1$ and $I_{mod}$ are determined (as previously explained), $I_0$, which drives the optical power level for logic "0" ($P_0$), can easily be determined by the following relation: $I_1-I_{mod}=I_0$. Thus, for each temperature, $P_0$, $P_1$, $I_0$, $I_1$, and of course $I_{mod}$ are all known or easily determined. Additionally, due to the foregoing calculations, all these values meet the required ER and other requirements for the system. Thus, all the operating points of the system are determined and can be used (in conjunction with the monitoring element 1006) to implement temperature compensation over the operational range of temperatures. Furthermore, because the modulation current ($I_{mod}$) is pre-determined and the $I_1$ is adjusted based on the optical power level detected by the monitor diode 1006, the design can automatically track the threshold current of the laser diode over temperature when a $P_{target\ avg}$ value is set because $I_1$ and $I_0$ will move up or down along with varying threshold currents (due to temperature changes or laser diode aging) wile maintaining same target average power and ER performance. This provides an advantage in dealing laser diodes with wide variations in threshold current or the situation when the laser diode is aging where threshold current can begin to change in an unpredictable manner.

In general, the apparatus functions as follows. Once the laser 1001 and fiber 1003 are coupled the temperature is determined (e.g., using temperature sensor 1007) and an initial measurement of the laser power are made. An associated signal sent from the temperature sensor 1007 to the table 1008. The table is consulted and the appropriate current $I_{mod}$ value is looked up. A signal associated with this current $I_{mod}$ value is received by the laser driver 1005. Additionally, compensation circuitry 1010 receives and compares target average power information (from operational power circuitry 1009) and monitor diode 1006 sensed power information. This comparison is used to increase or decrease $I_1$ (See, e.g., Eqn. 15 below). For example, when the optical transmitter is turned on, the initial $I_1$ is zero, and the monitor diode detects no optical power ($I_0$ is also zero because $(I_1-I_{mod})<0$). Circuitry 1010 will increase the $I_1$ signal because the $P_{target\_avg}$ is higher than the sensed power until the target power $P_{target\_avg}$ is reached. The $I_1$ signal (from 1010) and $I_{mod}$ signal (from 1008) are input to the driver 1005 to provide the driving current for the laser 1001 (remembering that $I_0$ can be derived by the laser driver 1005 using the relation $I_0=I_1-I_{mod}$ relationship. Contemporaneously, the monitoring element 1006 measures optical power produced by the laser 1001 and provides an associated signal to the temperature compensation circuitry 1010. The monitor signal from the monitoring element 1006 and the operational power signal from the circuitry 1009, which determines the $P_{target\ avg}$ value at the present temperature, are both received by the temperature compensation circuitry 1010. The temperature compensation circuitry 1010 processes both signals to determine whether the $I_1$ current should be increased or decreased to achieve the desired power level for the present temperature. The required $I_1$ current is then provided to the laser driver circuitry 1005 which supplies the requisite bias current to the laser 1001. This process is repeated as the temperature and power of the laser change thereby achieving temperature dependent power compensation.

Additionally, in an open loop implementation, inputs dictating $I_{mod}$ and $I_1$ are all that is required to operate a laser in a an optical link in accordance with the principles of the invention. In the depicted open loop implementation, an appropriate temperature dependent laser driving current (e.g., $I_{mod}$ and $I_1$) can be determined using measured SE values for the tested laser (described as follows) and the calculated $P_{target\ avg}$, $I_{mod}$, and $I_{th}$ values. One open-loop implementation is described as follows. At one temperature, at two different laser bias currents (currents above $I_{th}$), optical power levels are measured. These measurements can be used to determine slope efficiency (SE) and $I_{th}$. These values for SE and $I_{th}$, in conjunction with the data models (SE v. T and $I_{th}$ v. T), can be used to determine SE and $I_{th}$ across the entire range of temperatures. $I_1$ can then be determined for each temperature in the range. For example, an $I_1$ value can be calculated at one selected temperature $T_i$ as follows:

$$I_1(T_i) = \frac{P_{\text{target\_avg}}(T_i)}{SE(T_i)} + I_{th}(T_i) + \frac{I_{mod}(T_i)}{2} \quad \text{Eqn. 15}$$

Figure 11:
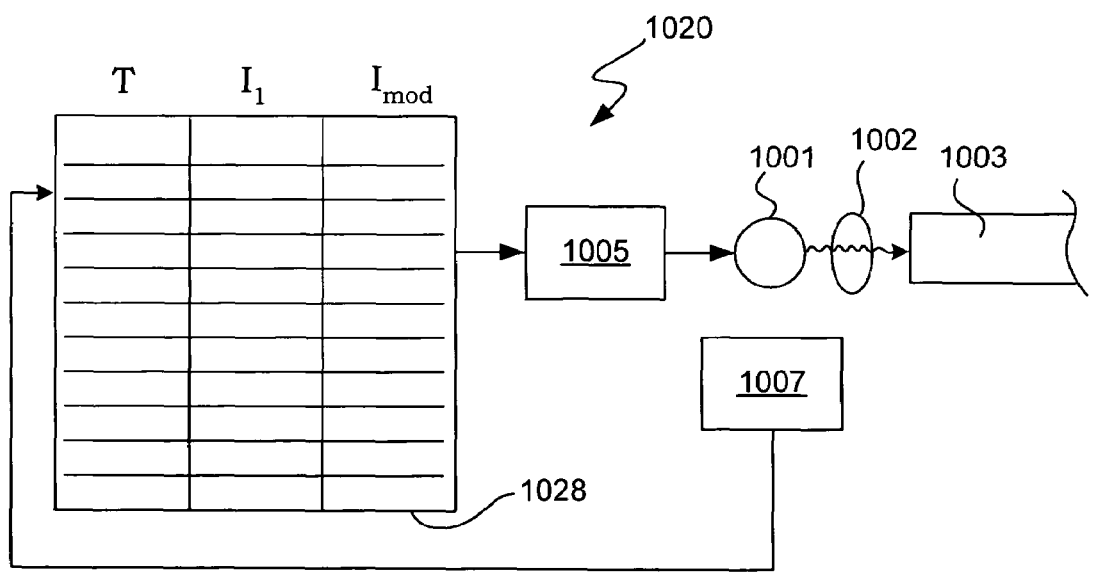
FIG. 11 is a simplified block depiction of an open-loop optical link having a laser emitter laser and an associated optical fiber constructed in accordance with the principles of the invention.

One implementation of such an open loop implementation is depicted in the apparatus 1120 of FIG. 11. FIG. 11 is a block diagram of an open loop laser apparatus 1120. The apparatus 1120 includes a semiconductor laser 1101 (e.g., a VCSEL type laser, side emitting diode laser, or other related device) coupled to an optical fiber 1103. Typically, a lens element 1102 is used to improve the power transmission into the fiber. Electronic driver circuitry 1105 is used to drive the laser 1101 (such driver circuitry can be similar to that of 1005 in FIG. 10). Additionally, a temperature sensor 1107 is used to detect the laser 1101 temperature. Information concerning the relationship between $I_1$, $I_{mod}$, and temperature are stored either on the apparatus 1120 or at some remote location. In the depicted implementation, this function is served by a temperature compensation table 1128 which forms part of the apparatus 1120. The temperature compensation table 1128 includes a table of temperatures (T) and associated tables of values for $I_1$ and $I_{mod}$ that are referenced to temperature. These tables can be generated using the measured SE value for the laser (1101) and the data models. Methods of generating such tables have been explained elsewhere in this patent. Each of the aforementioned values can be stored in the table 1128. The temperature is determined using the temperature sensor 1107 which produces an associated signal which can be used in conjunction with the table 1128 to determine an appropriate modulation current that will produce that desired laser output power.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method of establishing a trim and compensation scheme for a laser emitter in a fiber optic link where the laser emitter is selected from among a group of similar lasers, the method comprising:
   a) providing data models that characterize laser performance for a group of lasers, the models being generated using laser performance data obtained from measurements of laser properties taken from a sample group of lasers taken from the group of lasers;
   b) determining a base power level using information from the data models and a predetermined set of user specified performance parameters;
   c) determining whether the base power level satisfies a set of pre-specified operating parameters;
      if a laser having the determined base power level does not satisfy the set of pre-specified operating parameters, the user specified performance parameters are adjusted and the operations of b) and c) are repeated to determine a new base power level;
      if a laser having the determined base power level does satisfy the set of pre-specified operating parameters, then process moves on to the next operation d); and
   d) determining a relationship between temperature and associated current values that can be used to regulate laser performance over a range of temperature.

2. A method as in claim 1 wherein the base power level is used together with slope efficiency measurements of a specific laser and user specified optical power range window (W) to determine average target power levels thereby determining a relationship between temperature and associated average target power levels that can be used to regulate laser performance over the range of temperatures.

3. A method as in claim 1 wherein providing data models that characterize laser performance for a population of lasers include a model that describes a relationship between slope efficiency and temperature and a model that describes a relationship between threshold current and temperature.

4. A method as in claim 1 wherein determining a base power level b) includes using a predetermined set of user specified performance parameters including at least one of: an initial power value ($P_i$); a power range window (W); a temperature range; a power adjustment coefficient (PAC); a modulation current adjustment coefficient ($I_{mod\ adj}$) an extinction ratio (ER).

5. A method as in claim 1 wherein determining whether the base power level satisfies a set of pre-specified operating parameters includes determining whether the base power level satisfies extinction ratio (ER) conditions.

6. A method as in claim 1 wherein determining whether the base power level satisfies a set of pre-specified operating parameters includes determining whether the base power level satisfies extinction ratio (ER) conditions at each temperature in a range of temperatures.

7. A method as in claim 1 wherein determining whether the base power level satisfies a set of pre-specified operating parameters includes determining whether the base power level satisfies at least one of the operating parameter conditions at each temperature in a range of temperatures wherein the at least one operating parameter condition is selected from among: a maximum value for $I_1$, a maximum value for average current ($I_{avg}$), and a minimum $I_{offset}$ value.

8. A method as in claim 2 wherein generating a table of temperatures and associated current values includes generating a table associating a modulation current ($I_{mod}$) with a temperature for each temperature in a range of temperatures.

9. A method as in claim 1 wherein b) determining a base power level includes:
   i) determining modulation current values associated with a lowest temperature in a range of temperatures;
   ii) determining modulation current values associated with a highest temperature in the range of temperatures;
   iii) determining logical "1" current values associated wherein the logical "1" current values are associated with the with a highest temperature in the range of temperatures; and iv) determining the base power level using information associated with: the determination of modulation current values in i); the determination of modulation current values in ii); and the determination of the logical "1" current values in iii).

10. A method as in claim 9 wherein determining a modulation current values associated with a lowest temperature in a range of temperatures includes:
   determining best case slope efficiency values taking in to account error margin and coupling efficiency; and
   calculating modulation current value associated with a lowest temperature in the range of temperatures using the best case slope efficiency values.

11. A method as in claim 9 wherein determining a base power level includes:
   determining logical "0" current values;
   determining offset current values;
   using the offset current values and user specified performance parameters to determine a base power level.

12. A method as in claim 11 wherein determining a base power level includes:
   determining logical "0" current values by using the logical "1" current values determined at the highest temperature in the range of temperatures and using corresponding modulation current values determined at the highest temperature in the range of temperatures;
   determining offset current values by subtracting the logical "0" current values from a corresponding threshold current value determined from a data model;
   using a minimum offset current values and other user specified performance parameters to determine the base power level.

13. A method as in claim 1 further including the further operations of:
   e) trimming a specific laser emitter in a optical link using the base power level together with slope efficiency measurements of the specific laser over a range of temperatures to a determine target average power level for each temperature in the range of temperatures thereby defining a relationship between temperature and the associated target average power levels that can be used to regulate laser performance over the range of temperatures; and
   f) compensating for the effects of temperature by using the relationship between temperature and associated current and associated target average power values to regulate the laser emitter performance as temperature changes.

14. An optical link including a laser emitter in optical communication with an optical fiber wherein the optical link implements the trim and compensation scheme described in claim 13.

15. The optical link as in claim 14 wherein implementing the trim and compensation scheme comprises:
   detecting optical power produced by the laser emitter; and
   wherein compensating for the effects of temperature using the relationship between temperature and associated current and associated target average power values further includes using the detected optical power to regulate the laser emitter performance.

16. A laser emitter device suitable for coupling with an optical fiber in a fiber optic link, the emitter device comprising:
   semiconductor laser emitter;
   temperature sensor for detecting the temperature of the semiconductor laser emitter and producing an sensor output signal associated with the detected temperature;
   monitor element that detects the optical power level produced by the semiconductor laser emitter and generates an associated monitor output signal;
   look-up table having stored values for current information associated with temperature wherein the look-up table includes a listing of temperature values and zero bias current ($I_0$) values associated with the temperature values;
   laser driver circuitry for receiving temperature dependent current information from the table and using said current information to provide a driving current to the semiconductor laser emitter so that the laser emits an optical signal having a desired optical power;
   operational power circuitry for determining a suitable qualified optical power level at each temperature and generating an associated operational power output signal; and
   temperature compensation circuitry that receives the monitor output signal and receives the operational power output signal and determines whether a modulation current provided to the laser is to be adjusted to accommodate changing temperature conditions.

* * * * *